United States Patent
Nakagawa et al.

(10) Patent No.: US 7,250,781 B2
(45) Date of Patent: Jul. 31, 2007

(54) CIRCUIT BOARD INSPECTION DEVICE

(75) Inventors: Eigo Nakagawa, Kanagawa (JP); Koji Adachi, Kanagawa (JP); Kaoru Yasukawa, Kanagawa (JP); Norikazu Yamada, Kanagawa (JP); Koki Uwatoko, Kanagawa (JP); Tetsuichi Satonaga, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 159 days.

(21) Appl. No.: 10/721,461

(22) Filed: Nov. 26, 2003

(65) Prior Publication Data

US 2005/0017743 A1    Jan. 27, 2005

(30) Foreign Application Priority Data

| Dec. 19, 2002 | (JP) | 2002-367791 |
| Dec. 20, 2002 | (JP) | 2002-369283 |
| Jun. 23, 2003 | (JP) | 2003-177697 |

(51) Int. Cl.
*G01R 31/02* (2006.01)

(52) U.S. Cl. .................................... 324/755
(58) Field of Classification Search ............. None
See application file for complete search history.

(56) References Cited

U.S. PATENT DOCUMENTS

| 3,787,768 | A | * | 1/1974 | Kubota et al. .............. 324/754 |
| 5,177,528 | A | * | 1/1993 | Koromegawa et al. .. 324/158.1 |
| 5,517,110 | A | * | 5/1996 | Soiferman ................ 324/158.1 |
| 5,714,888 | A | * | 2/1998 | Naujoks ..................... 324/750 |
| 5,969,530 | A | * | 10/1999 | Yamashita ................. 324/754 |
| 6,097,202 | A | * | 8/2000 | Takahashi ................. 324/761 |
| 6,242,923 | B1 | * | 6/2001 | Scaman et al. ............. 324/529 |
| 6,331,782 | B1 | * | 12/2001 | White et al. ............... 324/763 |
| 6,353,327 | B2 | * | 3/2002 | Nishikawa ................. 324/758 |
| 6,459,272 | B1 | * | 10/2002 | Yamashita ................. 324/754 |
| 6,759,850 | B2 | * | 7/2004 | Harzanu et al. ............ 324/522 |
| 6,861,863 | B2 | * | 3/2005 | Ishioka et al. ............. 324/763 |
| 2002/0011861 | A1 | * | 1/2002 | Nishikawa ................. 324/758 |
| 2005/0104585 | A1 | * | 5/2005 | Bilik et al. ................. 324/765 |

FOREIGN PATENT DOCUMENTS

| JP | 59228174 | A | * | 12/1984 |
| JP | 60001574 | A | * | 1/1985 |
| JP | A 11-038111 |   |   | 2/1999 |
| JP | A 2000-74998 |  |   | 3/2000 |

\* cited by examiner

*Primary Examiner*—Jermele Hollington
(74) *Attorney, Agent, or Firm*—Oliff & Berridge, PLC

(57) ABSTRACT

A circuit board inspection device for inspecting the operation of a circuit board having a predetermined part or wire formed therein includes a supporting substrate disposed substantially in parallel with the parts mounting surface of the circuit board, and a signal change detection unit made of a coil or a capacitor disposed in a position of the supporting substrate corresponding to the part or wire of the circuit board, with the supporting substrate being disposed substantially in parallel with the circuit board.

31 Claims, 18 Drawing Sheets

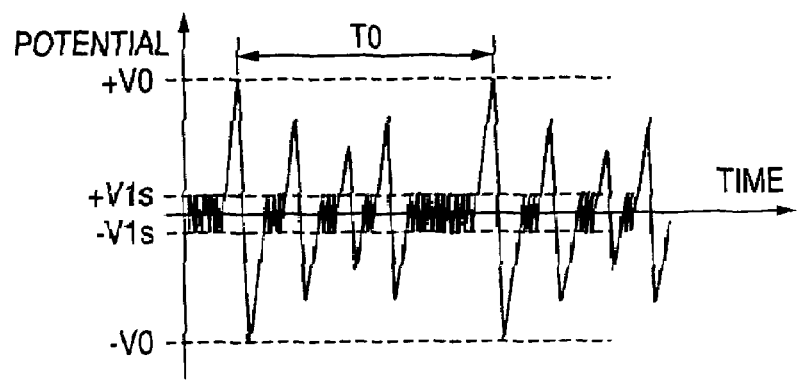
FIG. 3A
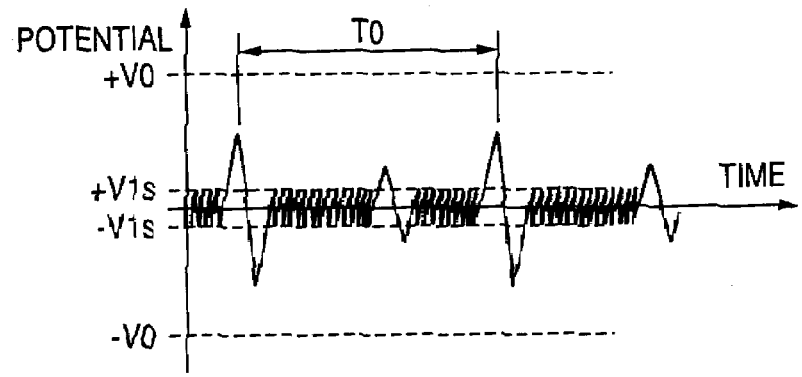
FIG. 3B
FIG. 4
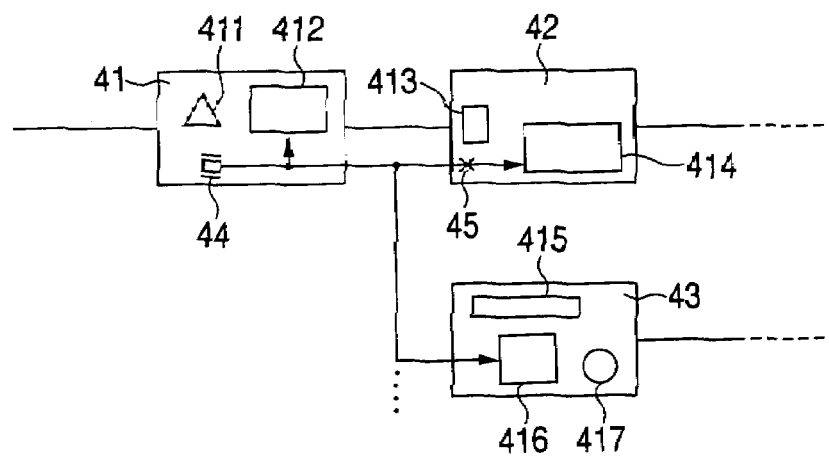

OPEN-COLLECTOR (C-1) NORMAL TIME    (C-2) ABNORMAL TIME

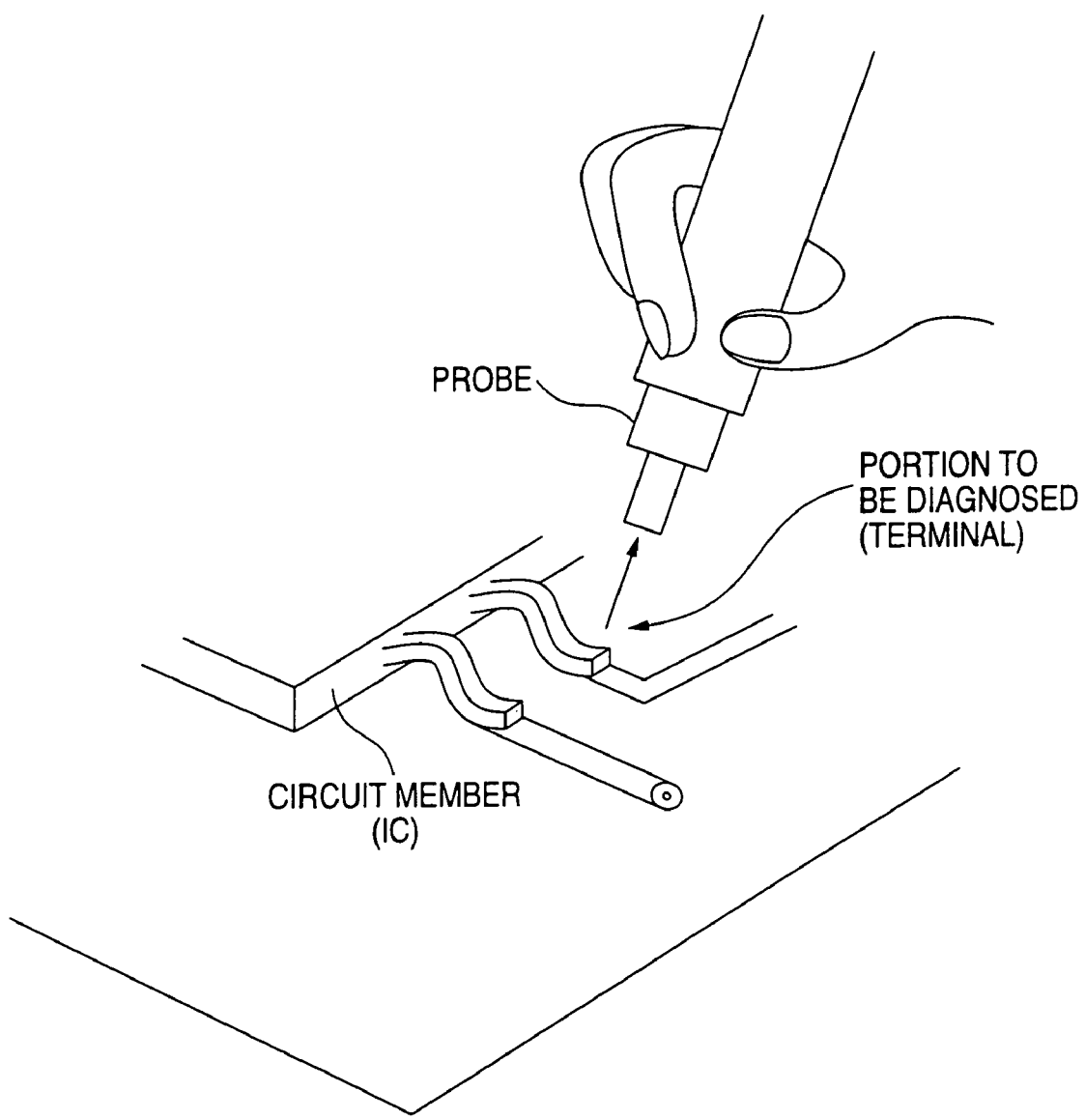

CIRCUIT BOARD INSPECTION DEVICE

The present disclosure relates to the subject matter contained in Japanese Patent Application No. 2002-367791 filed Dec. 19, 2002, Japanese Patent Application No. 2002-369283 filed Dec. 20, 2002, and Japanese Patent Application No. 2003-177697 filed Jun. 23, 2003, which are incorporated herein by reference in their entirety.

BACKGROUND OF THE INVENTION

1. Field of the Invention

The present invention relates to a device for detecting or diagnosing an abnormal/failure state of an electronic circuit, and particularly relates to a circuit board inspection device for predicting, detecting or preventing abnormality/failure in operation or performance of an electronic circuit, for example, in equipment having the electronic circuit which is called PWBA formed out of a plurality of circuit boards connected with one another.

Also, the present invention relates to a method for performing prediction or detection of abnormality or failure in operation or performance (hereinafter collectively referred to as "failure diagnosis") of circuit members in apparatus having a circuit board mounted with the circuit members, such as a printer, a facsimile machine or a multi-function machine having the same functions as the printer and the facsimile machine; a failure diagnosis system for effectuating the failure diagnosis method; and a printed wiring board for use in the failure diagnosis system.

2. Description of the Related Art

In recent years, with improvement in performance and function of electronic equipment such as personal computers or copying machines, more and more analog and digital electronic circuits for various applications for achieving the improvement have been stored in the form of printed boards. In addition, a large number of electronic circuit boards having high reliability and capable of operating at a high speed and with a high accuracy are mounted as means for operation control or the like in other industrial equipment such as automobiles, aircraft, robots, or semiconductor designing devices. When these electronic circuit boards are connected through cables in various forms, desired specifications for implementing a series of functions can be achieved.

Equipment mounted with such boards is used typically in an office or in a house, but may be used in an oppressive environment in some cases. Thus, the environment where such equipment is used is in a wide range. Particularly in a bad environment where the equipment is used, various abnormalities or failures difficult to be detected may occur in spite of normal use. Thus, a great deal of labor is required for restoring the equipment.

Even when the equipment is used in a normal environment, there may occur an abnormality or a failure in the electronic circuits. The location where the abnormality or the failure has been detected cannot be identified frequently though it cannot be the that the frequency of such an abnormality or a failure is low. Further, once there occurs an abnormality in the electronic circuit boards, a prompt countermeasure must be taken in view of safety, cost and so on.

As an example of such a countermeasure, when a person who is in charge of repairs is notified of information of abnormality or failure in a copying machine or a printer, the person in charge of repairs may rush to the scene to specify a failure location on the basis of failure location information, failure history information or the like recorded in the equipment and take action such as exchange or repair.

Alternatively, when such equipment is connected to a network so as to transmit information such as condition management or failure information automatically to a station for managing such information, the person in charge of repairs may analyze the information before taking such action.

However, when there occurs abnormality or failure as described previously, the equipment is usually out of commission, causing a downtime disadvantageously to the user side.

On the other hand, the maker side also faces the following situation. That is, it may take much labor to specify the failure location, or it is not always possible to specify the failure location correctly. Thus, it may cost a great deal to exchange all the possible parts for the failure. Alternatively, it may take much time for repair per se, or action to be taken may be delayed due to limited manpower. Thus, in fact, both the user side and the maker side are often in a situation leading to a great loss.

Therefore, to specify a failure location or to predict the occurrence of a failure per se, various approaches such as an approach to increase accuracy to specify the failure location, an approach to reduce a temporal loss in specifying the failure location, an approach to grasp various abnormal conditions or failure conditions without exception, and an approach to realize these approaches with a simple configuration and at a low cost have been taken.

One example is disclosed in "Detection of Flaws in a Printed Circuit Board by Using an Eddy-Current Testing Approach" (2002, written by Hisashi Fujiki et al. Faculty of Engineering, Kanazawa University http://magmac1.ec.t.kanazawa-u.ac.jp/magcap-j/research-j/ec ta-j.html, searched on Dec. 4, 2002).

This technique detects abnormalities by a non-contact method using a magnetic field detection probe small in size and unique in shape. The magnetic field detection probe detects a magnetic field generated from a current flowing through a target wire. When the magnetic field detection probe scans wiring of a board in a non-contact manner, abnormalities occurring in an existing high-density wiring printed board, including failures of ICs as well as disconnection/line-width abnormalities of the wiring in the board are detected in a high-speed and mechanical-stress-free state.

On the other hand, JP-A-2000-74998 specifies a failure in the following manner. That is, a power supply current for each electronic board is allowed to flow into a resistor connected in parallel with a power supply. Current information of the electronic board is read based on a potential difference between the opposite ends of the resistor, and compared with that in a normal state, so that a failure is judged.

However, such a circuit board inspection device has the following problems. That is, according to the technique disclosed in "Detection of Flaws in a Printed Circuit Board by Using an Eddy-Current Testing Approach", the conditions of a signal line on the circuit board or the magnetic field generated from the current flowing through the signal line can be sensed in a non-contact manner and with high accuracy, but an exclusive probe used as means for sensing the magnetic field is so expensive that it costs much to detect a failure. In addition, the area which can be measured at one time is a pinpoint. Thus, there occurs a problem that it takes much time or much labor to inspect a failure over the whole area of the circuit board.

On the other hand, according to the technique disclosed in JP-A-2000-74998, for example, a sensing portion has to be incorporated at the time of designing the circuit board and used fixedly. Thus, there occurs a problem that the technique is poor in flexibility of arrangement.

According to a typical method of failure diagnosis, a failure location is specified with voltages or signal waveforms in major locations monitored by means of a measuring device such as a tester. Since various locations have to be measured in such a diagnosis method, there is however a problem that it takes much labor for failure diagnosis to thereby result in deterioration of working efficiency.

Therefore, as a more efficient diagnosis method, there is a self-diagnostic system (Diagnostics system). According to the Diagnostics system, upon starting etc. of apparatus, the apparatus per se diagnoses a failure in each board or each electronic circuit. In the Diagnostics system, a failure diagnosis circuit for monitoring the circuit operation is provided at the time of designing electronic circuits. For example, a signal pattern (expected value) during the operation of the apparatus is monitored in every circuit module or every board or every circuit portion, and stored in advance. An output of the diagnosis circuit during actual operation is compared with the expected value. Thus, the existence of failure occurrence is diagnosed, and a failure location is specified.

On the other hand, with the recent improvement of performance and function, the operation of electronic circuits becomes more and more complicated. For this reason, the number of locations and the data width of each signal to be monitored for detecting a failure increase so that the scale of the failure diagnosis circuit increases. As a result, there is a problem that the number of man-hours for design increases so that the cost of the electronic circuits increases.

Therefore, to specify a failure location or to predict the occurrence of a failure per se, various approaches such as an approach to increase accuracy to specify the failure location, an approach to reduce a temporal loss in specifying the failure location, an approach to grasp various abnormal conditions or failure conditions without exception, and an approach to realize these approaches with a simple configuration and at a low cost have been taken.

For example, JP-A-11-38111 discloses apparatus for detecting a magnetic field generated by a current flowing through an electronic circuit. The apparatus proposed in JP-A-11-38111 measures a magnetic field generated from a current flowing through only one wire in circuit wiring of a printed circuit board or an LSI mounted in high density, at high resolution and in a non-contact manner while suppressing the influence of adjacent wires of the circuit wiring. With such apparatus, the operation of an electronic circuit to be failure-diagnosed can be monitored without providing a diagnosis circuit in the electronic circuit.

However, according to the method disclosed in Patent Document 1, the conditions of a signal line on the circuit board or the magnetic field generated from the current flowing through the signal line can be sensed in a non-contact manner and with high accuracy, but an expensive exclusive probe (sensing probe) has to be used as means for sensing the magnetic field. Thus, it costs much to detect a failure.

In addition, in order to check the conditions of any desired wire or terminal, the sensing probe has to be brought close to the vicinity of the wire or terminal for observation. This is because the detectable range of one probe is so narrow that the probe has to be brought close to a location to be diagnosed in order to diagnose the location accurately. Accordingly, for example, as shown in FIG. 21, as the means for bringing the probe close to a target portion, it is necessary to adopt a manner using manual operation, or to move the probe by use of mechanical means. It is therefore difficult to perform measurement in the state where the electronic circuit board is installed in a system such as electronic equipment, and it is necessary to perform failure diagnosis over the electronic circuit board off-line. As a result, it has to take much time and much labor. In addition, it is difficult to fix the position relation between the probe and the portion to be inspected. Thus, it is difficult to perform accurate inspection.

The circuit operation may be monitored all over the electronic circuit board with a plurality of exclusive probes installed in the system in order to monitor the circuit operation in a plurality of desired ranges. However, it costs a great deal for such a case. On the other hand, without adopting such a moving manner or with a small number of probes installed, only a range or ranges near the probe(s) can be detected. Thus, the detectable range becomes very narrow.

Thus, the related-art failure diagnosis method is not always user-friendly in view of the cost and the degree of freedom in setting a portion to be failure-diagnosed.

SUMMARY OF THE INVENTION

The present invention was developed to solve the foregoing problems. That is, the invention provides a circuit board inspection device for inspecting operation of a circuit board having a predetermined part and wire formed therein, including: a supporting substrate disposed substantially in parallel with a parts mounting surface of the circuit board; and a signal change detection unit disposed in a position of the supporting substrate corresponding to the part or wire of the circuit board, with the supporting substrate being disposed substantially in parallel with the circuit board.

According to the invention, the signal change detection unit is disposed in a position of the supporting substrate corresponding to a part or a wire of the circuit board. Thus, when the supporting substrate on which the signal change detection unit is disposed is disposed substantially in parallel with the circuit board, the signal change detection unit is aligned with the part or the wire so that the part or the wire mounted on the circuit board can be inspected easily and accurately. In addition, the signal change detection unit is disposed on the supporting substrate without necessity of incorporating the signal change detection unit in the circuit board. Thus, the signal change detection unit can be disposed in accordance with the parts layout of the circuit board to be inspected, so that the signal change detection unit can be applied to an existing circuit board.

The invention further provides a failure diagnosis method for diagnosing existence of a failure in a portion to be diagnosed, such as wiring of a circuit board or a part mounted on the circuit board, including the steps of: reading an induced electromotive force generated in a magnetic field sensing portion when a magnetic flux generated from a current flowing through the portion to be diagnosed is passed through a winding wire of a spiral coil functioning as the magnetic field sensing portion; and comparing the read induced electromotive force with a normal induced electromotive force measured in advance, to thereby diagnose existence of a failure in the portion to be diagnosed; wherein the spiral coil as the magnetic field sensing portion is placed so as to be opposed to the portion to be diagnosed, to have a magnetic path length substantially equal to or smaller than a width of the portion to be diagnosed, and further to be disposed perpendicularly and fixedly to a direction of the current flowing through the portion to be diagnosed.

Examples of specific forms as the "portion to be diagnosed" include a target part per se to be failure-diagnosed in the circuit board mounted with the portion to be failure-diagnosed, a terminal of the portion to be failure-diagnosed, and a wiring pattern connected to the portion to be failure-diagnosed.

To read the induced electromotive force generated in the magnetic field sensing portion, an induced electromotive voltage generated between open ends of the spiral coil may be read or a current flowing through the spiral coil may be read.

To dispose the spiral coil fixedly in a position corresponding to the portion to be diagnosed, the spiral coil may be formed out of a printed wiring pattern in an external layer (surface or back) or an internal layer in the circuit board, or may be formed out of a cable member and a retention member for fixing the physical position of the cable member.

The phrase "to dispose the spiral coil fixedly in a position corresponding to the portion to be diagnosed" means to dispose the spiral coil so as to have one to one correspondence to an individual portion to be diagnosed and to retain a fixed physical position relation between the winding wire of the coil and the portion to be failure-diagnosed, so as not to be affected by the other portions to be failure-diagnosed. For example, the circuit board and the coil winding wire are fixed physically. In the case of application to apparatus including a plurality of circuit boards, signal cables serving as signal interfaces among the plurality of circuit boards, and the coil winding wire are fixed physically.

A failure diagnosis system according to the invention is a system for effectuating the failure diagnosis method according to the invention. The failure diagnosis system includes: a spiral coil functioning as a magnetic field sensing portion, opposed to a portion to be diagnosed, having a magnetic path length substantially equal to or smaller than a width of the portion to be diagnosed, and further disposed perpendicularly and fixedly to a direction of a current flowing through the portion to be diagnosed; and a failure diagnosis portion for diagnosing existence of a failure in the portion to be diagnosed by reading an induced electromotive force generated in the magnetic field sensing portion when a magnetic flux generated from the current flowing through the portion to be diagnosed is passed through a winding wire of the spiral coil functioning as the magnetic field sensing portion and by comparing the read induced electromotive force with a normal induced electromotive force measured in advance.

A printed wiring board according to the invention is a board for use in the failure diagnosis system according to the invention. The printed wiring board includes: a spiral coil functioning as a magnetic field sensing portion, opposed to the portion to be diagnosed, having a magnetic path length substantially equal to or smaller than a width of the portion to be diagnosed, and further disposed perpendicularly and fixedly to a direction of the current flowing through the portion to be diagnosed.

The invention provides more advantageous specific embodiments of failure diagnosis systems or printed wiring boards.

In the configuration according to the invention, first, the spiral coil functioning as the magnetic field portion is disposed fixedly so as to have one to one correspondence to an individual portion to be diagnosed and to retain a fixed physical position relation between the winding wire of the coil and the portion to be diagnosed. Then, a magnetic flux generated from a current flowing through the wiring of a circuit board or a part mounted on the circuit board is passed through the winding wire of the spiral coil functioning as the magnetic field sensing portion, so as to read an induced electromotive force generated in the magnetic field sensing portion. The read induced electromotive force is compared with a normal induced electromotive force measured in advance. Thus, the existence of a failure in the wiring of the circuit board or the part mounted on the circuit board is diagnosed.

BRIEF DESCRIPTION OF THE DRAWINGS

FIGS. 3A–3B are diagrams for explaining inspection;

FIG. 4 is a diagram showing a first example;

FIG. 21 is a view showing the outline of a mechanism for bringing a probe close to a target portion manually.

DETAILED DESCRIPTION OF THE PREFERRED EMBODIMENTS

First Embodiment

Figure 1A:
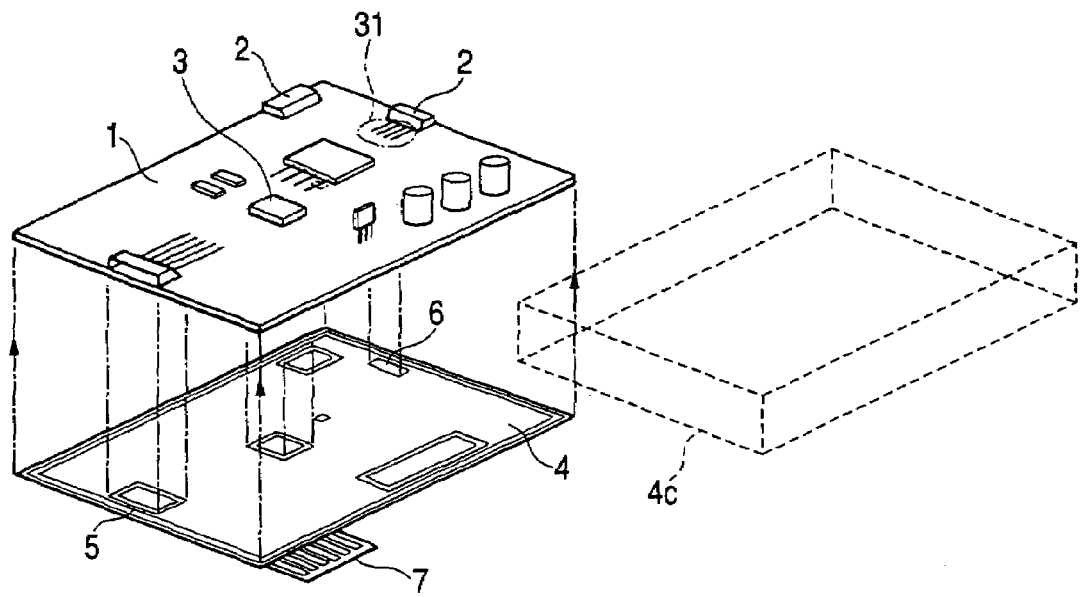
FIGS. 1A–1E are diagrams showing a first embodiment of the invention.

An embodiment of the invention will be described below with reference to the drawings. FIGS. 1A–1E and FIGS. 2A–2B are diagrams for explaining a circuit board inspection device according to this embodiment. FIGS. 3A–3B are diagrams for explaining inspection. The circuit board inspection device according to this embodiment is to inspect the operation of a circuit board 1 having a predetermined part 3 or wire formed thereon. The circuit board inspection device includes a supporting substrate 4 and a signal change detection unit (a coil 5 or a capacitor 6). The supporting substrate 4 is disposed substantially in parallel with the parts mounting surface of the circuit board 1. The signal change detection unit is disposed in a position of the supporting substrate 4 corresponding to the part 3 or wire of the circuit board 1, with the supporting substrate 4 being disposed substantially in parallel with the circuit board 1.

The signal change detection unit has a coil for generating an induced electromagnetic force in accordance with a magnetic field generated from a current flowing through the part 3 or wire, or an impedance component (constituted by a capacitive component, an inductive component or a resistive component) for generating potential information in accordance with a change of a signal flowing through a current wire.

To provide the circuit board inspection device, a flexible board which is a planar insulating plate is used as the supporting substrate 4, and the coil 5 or the capacitor 6 is formed on the flexible board. In FIG. 1A, the coil 5 is disposed to surround the periphery of a connector 2 disposed on the circuit board 1 or the outer circumference of the circuit board 1, or the coil 5 is disposed to surround the circumference of the predetermined part 3 (e.g. integrated circuit). In addition, a configuration (e.g. a capacitor 6) functioning as a capacitive component is disposed to cross, at right angles, an input/output wire group connected to a specific connector 2.

The supporting substrate 4 made of a flexible board has substantially the same dimensions lengthwise and crosswise as the circuit board 1 to which the supporting substrate 4 will be applied. The supporting substrate 4 is disposed in a position where the coil 5 or the capacitor 6 formed on the flexible board will be assigned just to a desired location when the circuit board 1 and the flexible board are put on top of each other and substantially in parallel with each other. An electric signal from each portion disposed thus is connected to a signal extraction portion 7, and extracted from the signal extraction portion 7 to the outside.

When there are a plurality of signal change detection units each comprised of a coil 5 or a capacitor 6, one-side terminals of the signal change detection units may be connected in common to an end portion of the supporting substrate 4. Alternatively, a connection terminal in which the one-side terminals are connected in common may be grounded outside the supporting substrate 4. Further, the wires from the signal change detection units are led over the supporting substrate 4 so as to be close to one another and substantially in parallel with one another. Such wiring allows the coils 5 or the capacitors 6 to catch a signal change accurately.

In a portion of the supporting substrate 4 where no signal change detection unit is disposed, there maybe apart interfering when the supporting substrate 4 is brought close to the circuit board 1. In such a case, a hole (not shown) can be provided in a position of the supporting substrate 4 corresponding to the part so as to prevent the part from abutting against the supporting substrate 4.

Figure 1C:
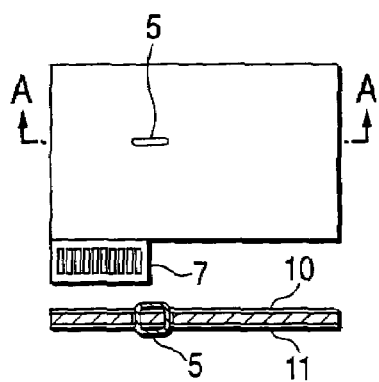
Figure 1D:
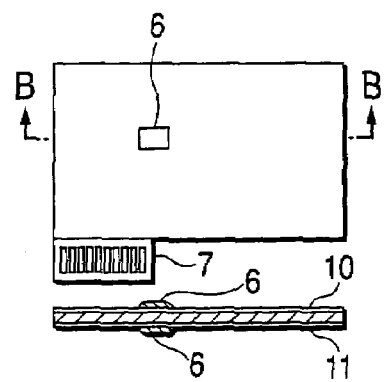
Figure 1B:
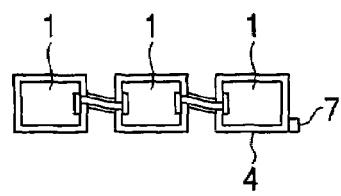

FIG. 1B shows another application to a circuit board. When the circuit board inspection device is applied not to the circuit board 1 alone but to a circuit board group having a plurality of circuit boards 1 connected with one another, supporting substrates 4 made of flexible boards having equal dimensions as shown in FIG. 1B are fixed substantially in parallel with and close to the circuit board group and cables for connecting the circuit boards 1 with one another, so as to detect the conditions of the respective portions in the aforementioned manner.

FIG. 1C shows another shape of the coil formed. This coil is used to sense a portion of a magnetic field generated in parallel with the circuit board 1 when the circuit board 1 is driven, similarly to the case where the coil is formed directly on the supporting substrate 4. Accordingly, the coil 5 is formed by use of two dimensions, in the thickness direction, of signal layers 10 and 11 formed on the front and back of the supporting substrate 4.

Figure 1E:
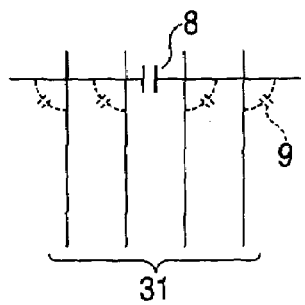

FIG. 1D shows a configuration example of the capacitor 6 formed on the supporting substrate 4. Electrodes having desired areas are formed on the opposite sides of the signal layers 10 and 11 of the supporting substrate 4 so as to form the capacitor 6. Signal lines connected to the electrodes respectively are connected to the signal extraction portion 7. Thus, potential information generated between the electrodes due to cross talk is extracted. FIG. 1E shows an equivalent circuit when FIG. 1D is assigned onto a wire group actually.

Figure 2A:
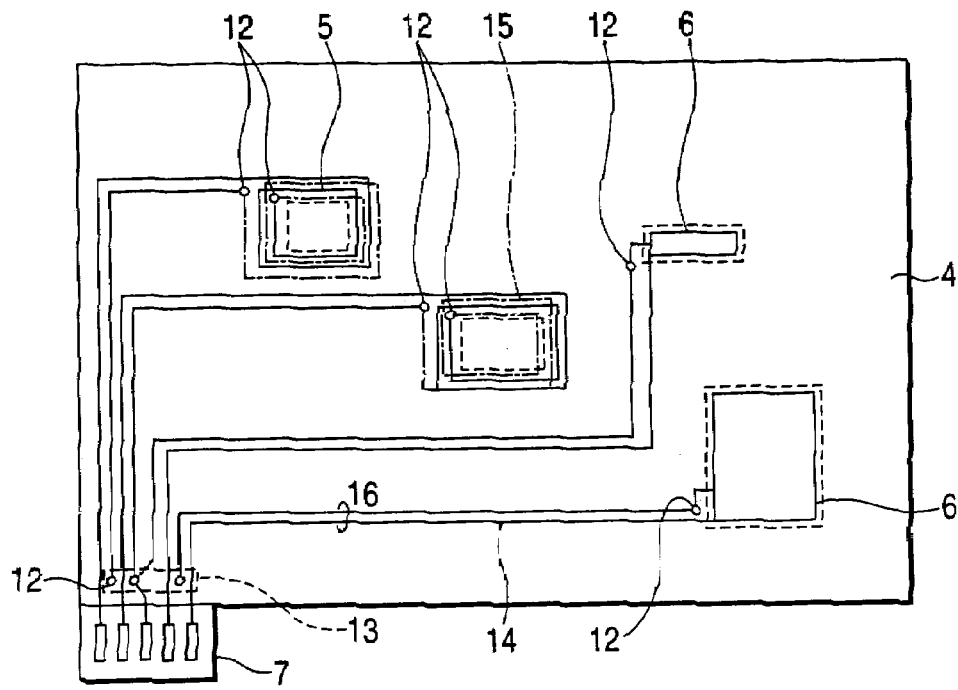
FIGS. 2A–2B are diagrams showing the first embodiment.

FIG. 2A is a diagram showing the state where two four-turn coils 5 and capacitors 6 having the illustrated dimensions are arranged on a supporting substrate 4 by way of example. The supporting substrate 4 has an insulating layer in its central portion with respect to its thickness direction, and signal layers on the both sides of the insulating layer. To avoid electric contact with the outside, the supporting substrate 4 may be coated with insulating resin or the like.

Each coil 5 is formed so that two turns on one of two signal layers are in the same direction as two turns on the other signal layer, and they are connected between the two layers via through holes 12. In FIG. 2A, the two-turn coil winding formed on the surface layer as shown by the solid line is connected to the two-turn coil winding (the chain line in the drawing) formed on the other layer on the opposite side through a through hole 12.

Wires 15 connected to the opposite ends of the coil 5 are paired and led to the vicinity of the signal extraction portion 7 in parallel with each other. One of the wires 15 moves to the other layer again through a through hole 12 so as to be connected to one of paired wires of another signal line. The connected wires are extracted through the signal extraction portion 7. The other wire of each signal line is extracted from the signal extraction portion 7 independently.

Likewise, as for each capacitor 6, wires 14 are connected to the paired electrodes formed on the front and back of the supporting substrate 4 respectively, and one of the wires 14 is led to the other layer through a through hole 12. Then, the wires 14 are led to the signal extraction portion 7 in parallel with each other in the form of a wire pair 16.

Figure 2B:
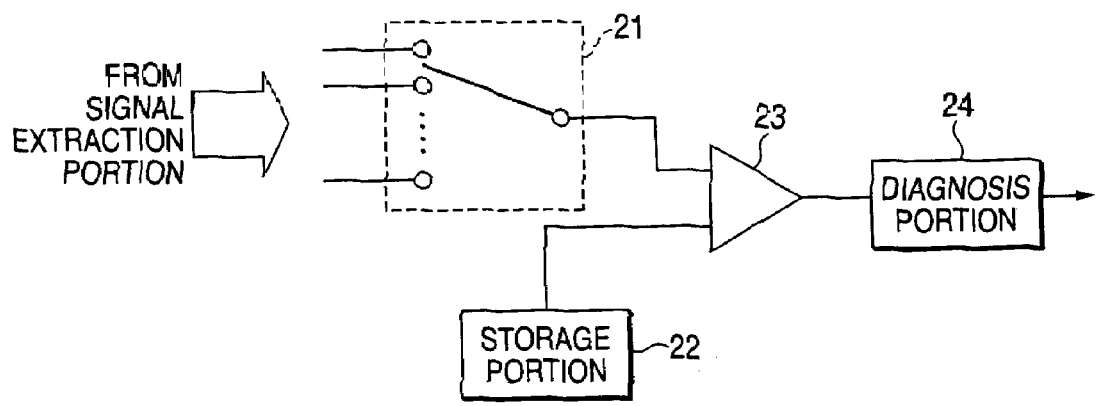

FIG. 2B is a block diagram showing the process for analyzing a signal extracted through the signal extraction portion 7 in FIG. 2A, and diagnosing the signal as to whether there occurs an abnormality in the circuit board or not. Of signals sent from the signal extraction portion 7, a desired signal is selected by a signal selection portion 21. On the other hand, data obtained by measuring the normal state of each signal to be extracted from the signal extraction portion 7 is stored in a storage portion 22 in advance. The state of the signal selected by the signal selection portion 21 is compared with its normal state by a signal check portion 23. Thus, a difference between the signals is extracted.

A diagnosis portion 24 is a portion for judging whether the difference extracted by the signal check portion 23 is in a range equal to that in the normal state by comparison. The diagnosis portion 24 diagnoses the circuit board or the portion to be diagnosed as to whether it operates normally or not. Incidentally, all the signal selection portion 21, the storage portion 22, the signal check portion 23 and the diagnosis portion 24 may be provided on the supporting substrate 4 or may be provided outside the supporting substrate 4. Alternatively, a part of the portions 21 to 24 may be provided on the supporting substrate 4 while the remaining part of the portions 21 to 24 is provided outside the supporting substrate 4.

FIGS. 3A and 3B are diagrams for explaining a change of magnetic field information using the circuit board inspection device according to this embodiment, in which the ordinate designates the induced electromotive force, and the abscissa designates the time. FIG. 3A shows a result of measurement in a normal state. When abnormality occurs in a part of the circuit board, a result in which the amplitude is reduced is obtained as shown in FIG. 3B.

Thus, it is possible to diagnose a predetermined circuit board as to whether a failure occurs in the circuit board or not. In addition, the circuit board inspection device according to this embodiment can be added to the circuit board after designing of the circuit board independently of the design of the circuit board. Thus, the circuit board inspection device can be provided as a very flexible detection unit.

FIGS. 4, 5A–5B, 6A–6B, 7, 8A–8B and 9A–9B are diagrams for explaining specific examples of this embodiment. First, description will be made on a first example with reference to FIGS. 4, 5A–5B and 6A–6B. Circuit board inspection devices according to this embodiment described previously are respectively attached close to circuit boards 41, 42 and 43 shown in FIG. 4. In accordance with the circuitry, coils are formed in the respective circuit board inspection devices so as to surround the circumferences of circuit portions 411, 412, 413, 414, 415, 416 and 417 respectively.

FIGS. 5A–5B and 6A–6B show the waveforms of induced electromotive forces generated due to magnetic fields sensed by the coils formed to surround the circuit portion 412 on the board 41 and the circuit portion 414 on the board 42 respectively when the circuit board inspection devices according to this embodiment are brought close to the circuit portions 412 and 414.

Figure 5A:
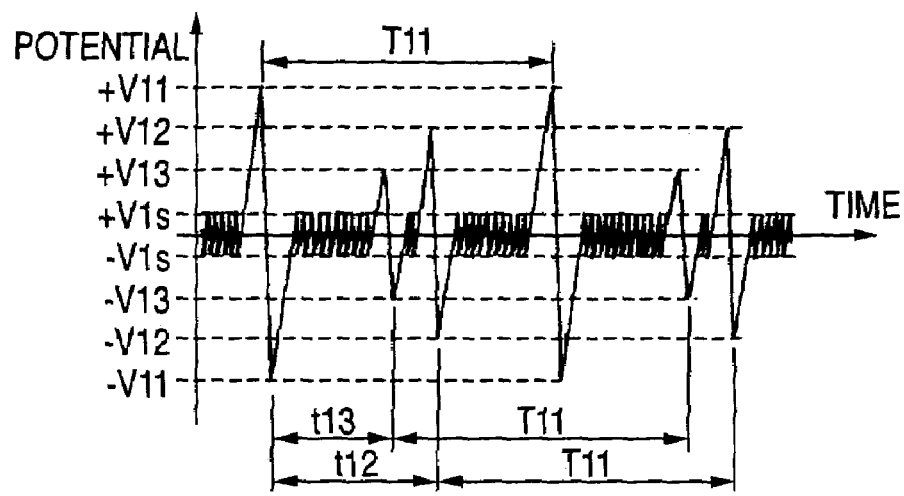
FIGS. 5A–5B are diagrams for explaining inspection in the first example.
Figure 5B:
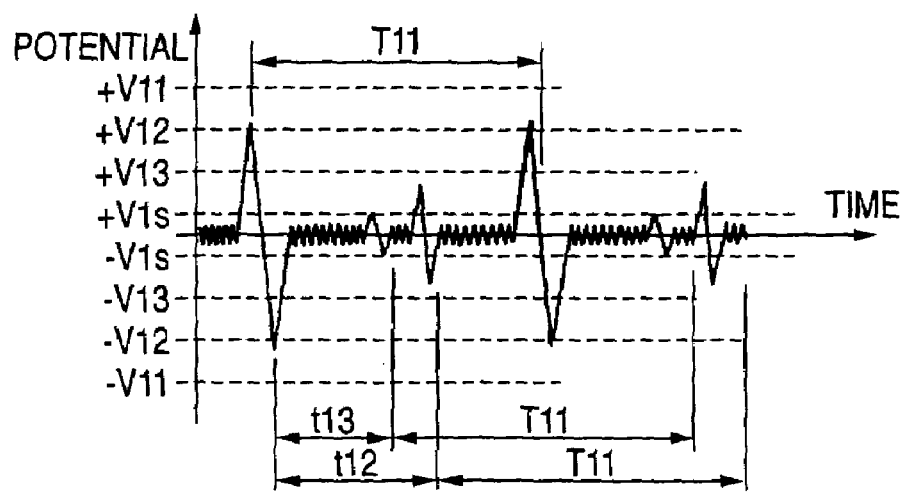
Figure 6A:
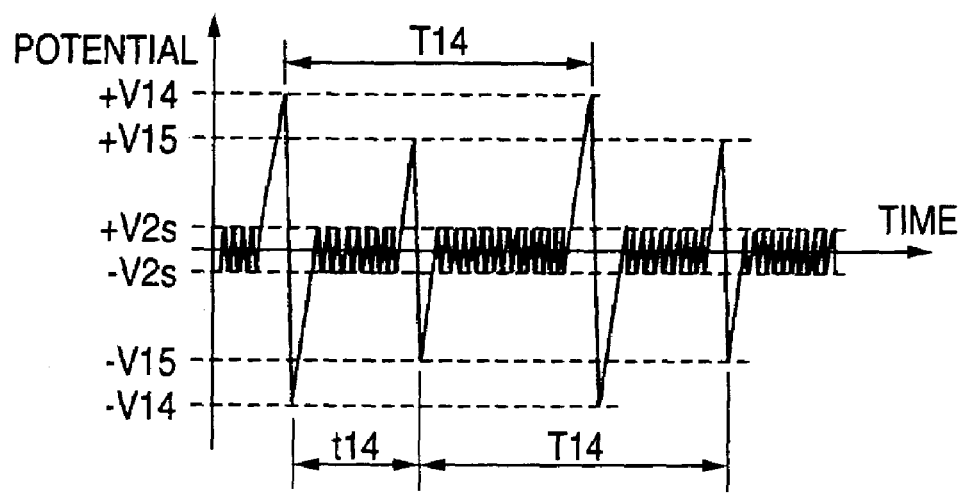
FIGS. 6A–6B are diagrams for explaining inspection in the first example.
Figure 6B:
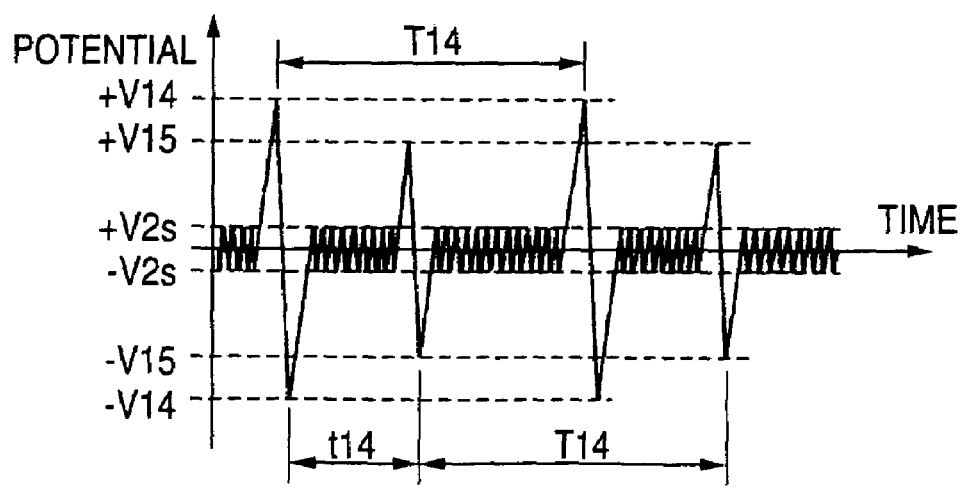

FIG. 5A and FIG. 6A show normal waveforms, and FIG. 5B and FIG. 6B show waveforms when a disconnection abnormality 45 occurs. As for the circuit portion 414 on the board 42 operating in response to a clock generated by an oscillator 44 on the board 41, a temporal change of an induced electromotive force generated due to a magnetic field sensed by the coil formed on the supporting substrate to surround the circuit portion 414 is observed as a waveform having three peaks $\pm V11$, $\pm V12$ and $\pm V13$ in a period T11 as shown in FIG. 5A when each board operates normally.

Likewise as for the circuit portion 412 on the board 41 operating in response to the clock signal generated by the oscillator 44, a change of an induced electromotive force generated due to a magnetic field sensed by the coil formed on the supporting substrate to surround the circuit portion 412 is observed as a waveform having two peaks $\pm V14$ and $\pm V15$ in a period T14 as shown in FIG. 6A.

Now, among the respective boards connected as shown in FIG. 4, assume that there occurs an abnormality 45 that the cable line for sending the clock from the board 41 to the board 42 by the oscillator driven on the board 41 is disconnected on the board 42.

In this event, since the circuit portion 412 on the board 41 operates normally, no special change is observed in the magnetic field in the circuit and its peripheral portion sensed by the coil. Accordingly, no special change is observed either in the induced electromotive force waveform generated between the opposite ends of the coil, as shown in FIG. 6B.

However, a clock signal required for circuit operation is not supplied to the circuit portion 414 on the board 42 due to the disconnection, and the circuit does not operate normally. Thus, the induced electromotive force waveform obtained from the coil formed to surround the circuit portion 414 changes so largely as to obtain a result that the amplitude having three peaks is far lower than the amplitude in the normal state as shown in FIG. 5B.

Though not shown, any other circuit portion is not affected especially. Thus, there is no change between the induced electromotive force waveform from the circuit portion and its normal one, as well as between the induced electromotive force waveform obtained from the coil formed to surround the circuit portion 412 and its normal one. Form these results, it is possible to diagnose the abnormality as occurring in the board 42.

Figure 7:
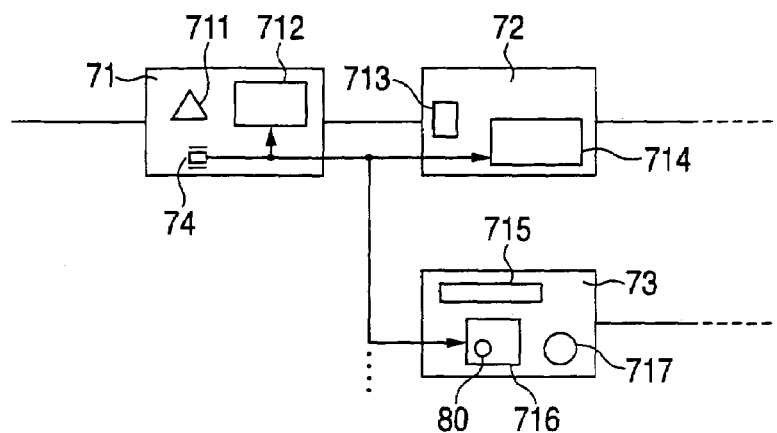
FIG. 7 is a diagram showing a second example.

Next, a second example in which another failure state is detected will be described with reference to FIGS. 7, 8A–8B and 9A–9B. FIG. 7 is a schematic diagram showing the circuitry for explaining the second example. The configurations of circuit boards 71, 72 and 73, connections between the circuit boards 71, 72 and 73, and the configurations of flexible boards brought close to the circuit boards respectively are similar to those in the first example. However, assume that some detailed circuitry about each circuit portion differs from that in the first example.

FIGS. 8A–8B and 9A–9B show induced electromotive force waveforms generated due to magnetic fields sensed by the coils formed to surround a circuit portion 714 on the board 72 and a circuit portion 716 on the board 73 respectively when the flexible boards are brought close to the circuit portions 714 and 716 respectively.

Figure 8A:
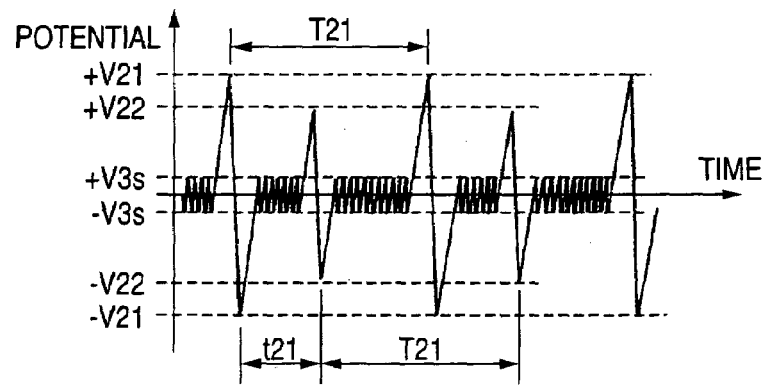
FIGS. 8A–8B are diagrams for explaining inspection in the second example.
Figure 8B:
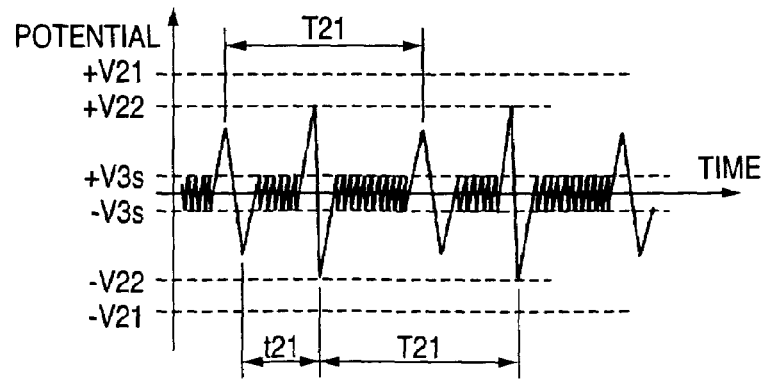
Figure 9A:
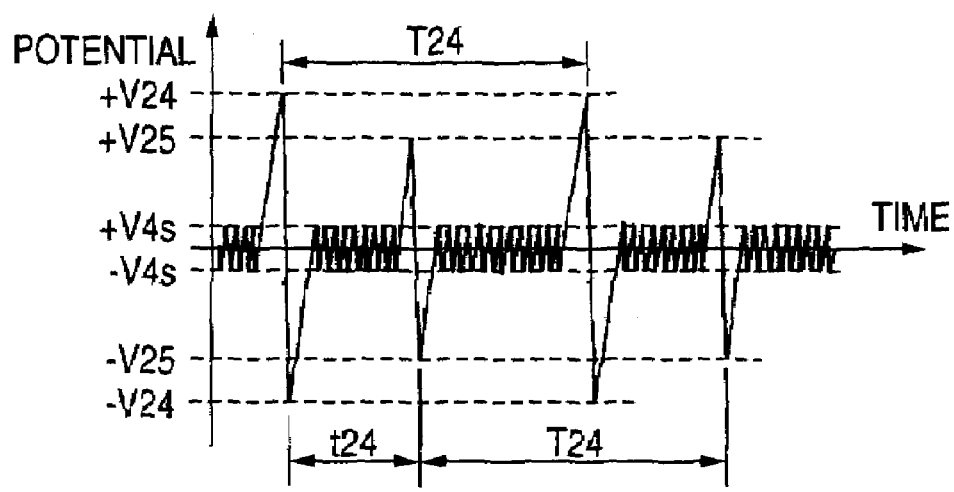
FIGS. 9A–9B are diagrams for explaining inspection in the second example.
Figure 9B:
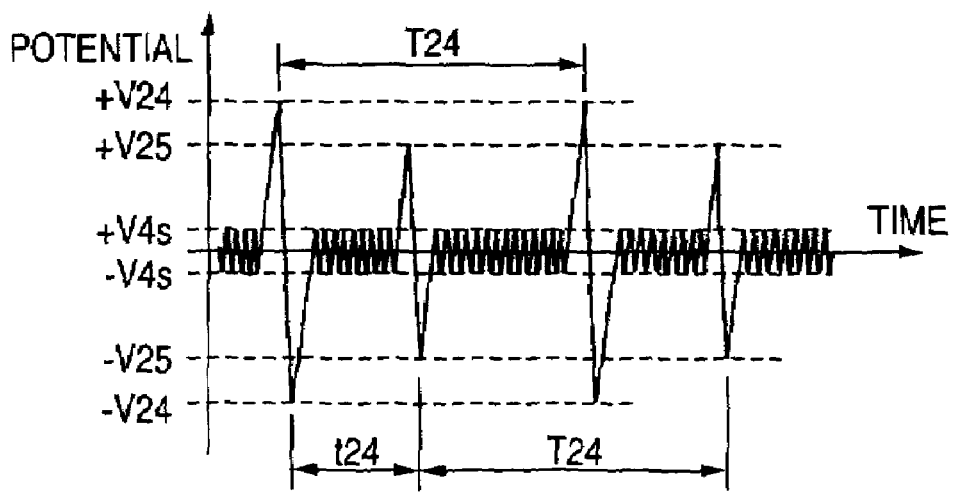

FIG. 8A and FIG. 9A show normal waveforms, and FIG. 8B and FIG. 9B show waveforms when there occurs a phenomenon that an area 80 in the circuit portion 716 fails in operation.

As for the circuit portion 716 on the board 73 operating in response to a clock generated by an oscillator 74 on the board 71, a temporal change of an induced electromotive force generated due to a magnetic field sensed by the coil formed on the flexible board to surround the circuit portion 716 is observed as a waveform having two peaks $\pm V21$ and $\pm V22$ in a period T21 as shown in FIG. 8A when each board operates normally.

Likewise as for the circuit portion 714 on the board 72 operating in response to the clock signal from the oscillator 74, a change of an induced electromotive force generated due to a magnetic field sensed by the coil formed on the flexible board to surround the circuit portion 714 is observed as a waveform having two peaks ±V24 and ±V25 in a period T24 as shown in FIG. 9A.

Now, among the respective boards connected as shown in FIG. 7, assume that there occurs a phenomenon that the area 80 in the circuit portion 716 driven with reference to the clock sent from the board 71 to the board 72 and the board 73 by the oscillator driven on the board 71 fails in operation.

In this event, since the circuit portion 714 on the board 72 operates normally, no special change is observed in the magnetic field in the circuit and its peripheral portion sensed by the coil. Accordingly, no special change is observed either in the induced electromotive force waveform generated between the opposite ends of the coil, as shown in FIG. 9B.

However, due to the abnormality occurring in the circuit portion 716 on the board 73, the circuit portion 716 on the board 73 does not operate normally, and the current change which is a factor in generating the magnetic field in the same manner as in the normal state is not normal, either.

Thus, the induced electromotive force waveform obtained from the coil formed to surround the circuit portion 716 changes so largely as to obtain a result that the amplitude having two peaks is far lower than the normal one as shown in FIG. 8B.

Though not shown, any other circuit portion is not affected especially. Thus, there is no change between the induced electromotive force waveform from the circuit portion and its normal one, as well as between the induced electromotive force waveform obtained from the coil formed to surround the circuit portion 714 and its normal one. Form these results, it is possible to diagnose the abnormality as occurring in the board 73.

Incidentally, in this example, each coil for sensing a magnetic field is disposed to come close to the circumference of a circuit portion when the flexible board is brought close to the circuit board. This means that the coil is installed in a position where it can sense most necessary information.

In addition, this example suggests that the coil is formed on the flexible board, and the flexible board is fixed to a circuit board, a cable or the like. However, the flexible board serving as the supporting substrate 4 may be made assemblable into a box 4c (see FIG. 1A) so that inspection can be performed upon a circuit board or a cable to be inspected is stored in the box.

Second Embodiment

Figure 10:
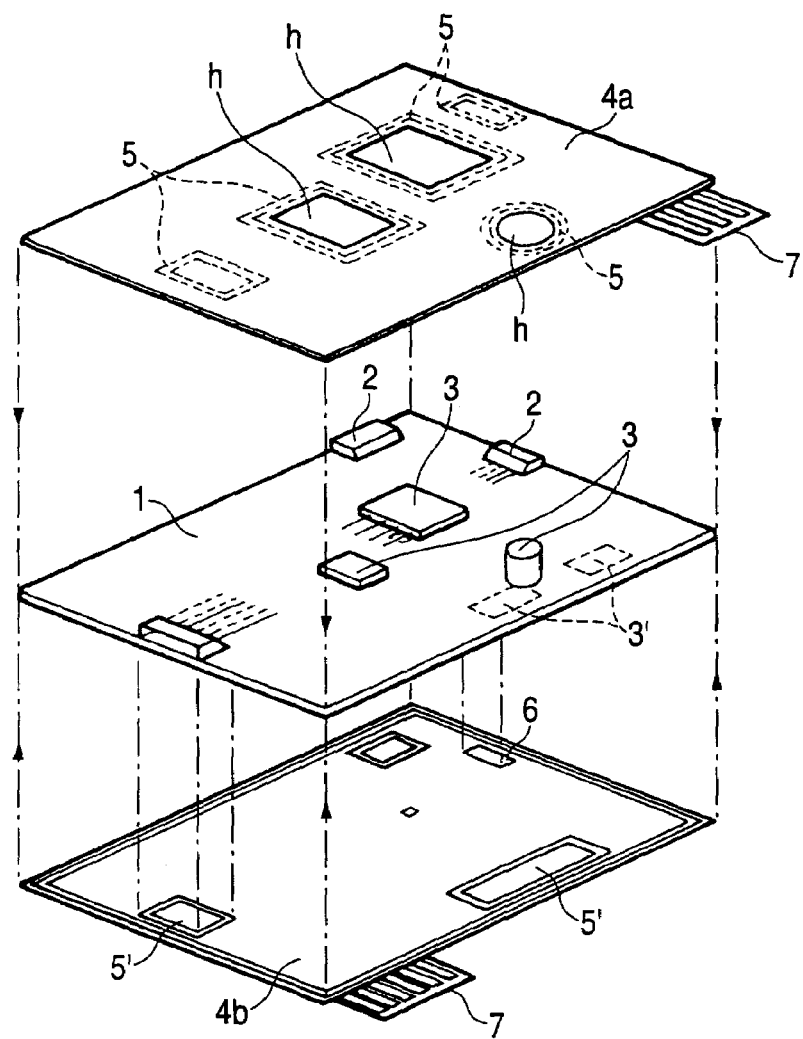
FIG. 10 is a schematic perspective view showing a second embodiment of a circuit board inspection device.

FIG. 10 is a schematic perspective view for explaining another embodiment of a circuit substrate inspection device. The circuit substrate inspection device has a front-side supporting substrate 4a and a back-side supporting substrate 4b as supporting substrates disposed substantially in parallel with the parts mounting surface of the circuit board 1. The front-side supporting substrate 4a is disposed on the front side of the circuit board 1, and the back-side supporting substrate 4b is disposed on the back side of the circuit board 1.

This circuit board inspection device deals with a circuit board 1 to be inspected, in which parts 3 and wires connected to connectors 2 are provided on the opposite, front and back sides of the circuit board 1. In the circuit board inspection device, signal change detection units are disposed on the front-side supporting substrate 4a correspondingly to the positions of parts and the like disposed on the front side of the circuit board 1. On the other hand, signal change detection units are disposed on the back-side supporting substrate 4b correspondingly to the positions of parts and the like disposed on the back side of the circuit board 1. Incidentally, although an example in which coils 5 are used as the signal change detection units will be described chiefly, capacitors 6 as described previously may be used instead.

Flexible boards are used as the front-side supporting substrate 4a and the back-side supporting substrate 4b. In addition, the coils 5 serving as the signal change detection units are provided in positions where the coils 5 will surround the peripheries of the parts 3 and the like when the front-side supporting substrate 4a and the back-side supporting substrate 4b are disposed substantially in parallel with the circuit board 1 respectively.

For example, on the front-side supporting substrate 4a, coils 5 are provided in positions corresponding to parts 3 or wires mounted on the front side of the circuit board 1. On the other hand, on the back-side supporting substrate 4b, coils 5' are provided in positions corresponding to parts 3' or wires mounted on the back side of the circuit board 1.

In addition, in the front-side supporting substrate 4a disposed on the circuit board 1 from the front side, holes h not smaller in size than the parts 3 respectively are provided in positions corresponding to the portions where the parts 3 are mounted. Thus, the coils 5 are brought into tight contact with the surface of the circuit board 1. The coils 5 are formed to surround the holes h respectively. Incidentally, similar holes h may be provided in the back-side supporting substrate 4b if necessary.

In such a manner, of the front-side supporting substrate 4a and the back-side supporting substrate 4b, only one corresponding to the side where the parts 3 or wires to be inspected are disposed (with respect to the power supply layer or the ground layer of the circuit board 1) is provided with the coils 5.

Figure 11:
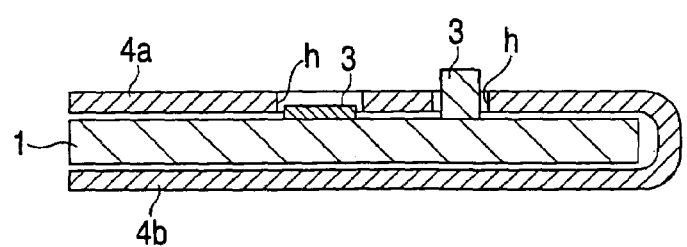
FIG. 11 is a schematic sectional view for explaining an example in which a front-side supporting substrate and a back-side supporting substrate are formed integrally.

The front-side supporting substrate 4a and the back-side supporting substrate 4b may be provided separately. However, as shown in FIG. 11 which is a schematic sectional view, the front-side supporting substrate 4a and the back-side supporting substrate 4b may be formed integrally so as to be bent halfway, so that the supporting substrate 4a and 4b are brought into tight contact with the front and back of the circuit board 1. When the front-side supporting substrate 4a and the back-side supporting substrate 4b are formed integrally, the coils serving as the signal change detection units may be formed astride both the front-side supporting substrate 4a and the back-side supporting substrate 4b.

Figure 12A:
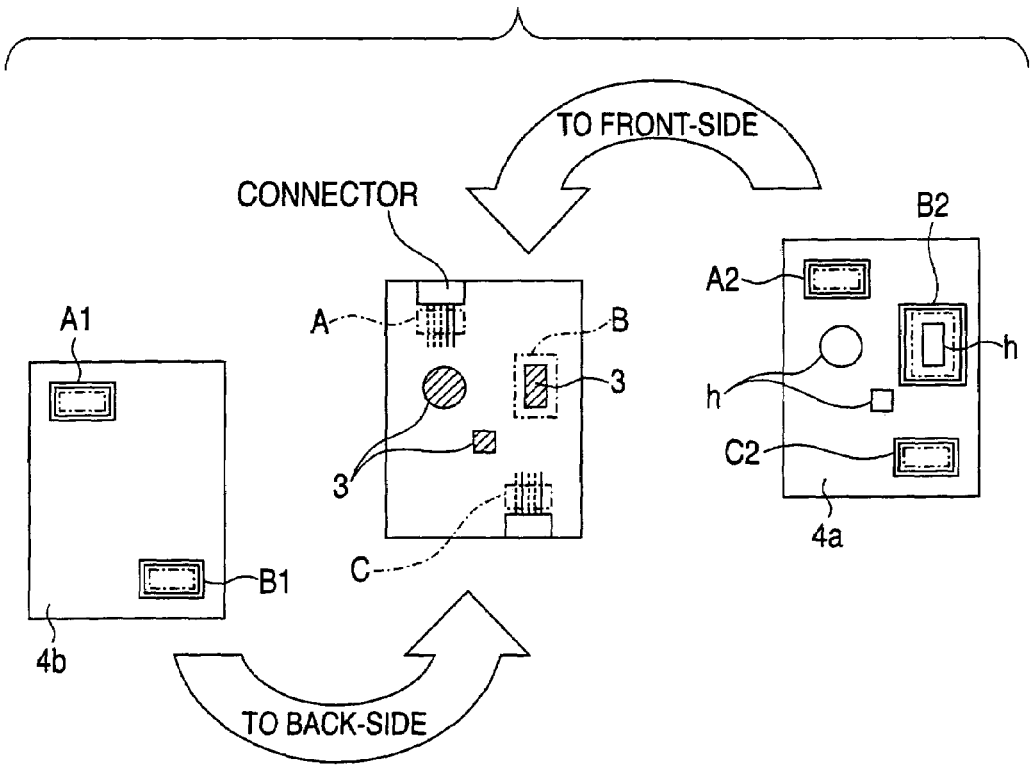
FIGS. 12A–12B are diagrams for explaining a specific example when supporting substrates are disposed on the front side and the back side of a circuit board.
Figure 12B:
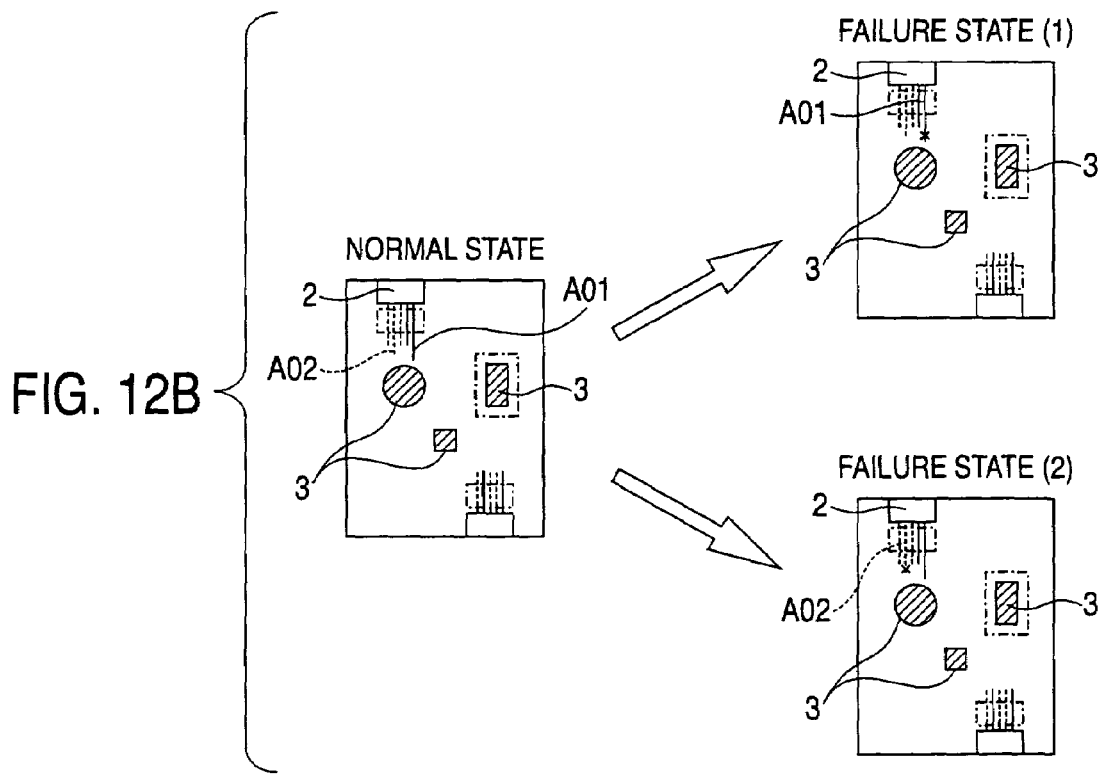

FIGS. 12A–12B are schematic diagrams for explaining a specific example when supporting substrates are disposed on the front and back of a circuit board. Coils serving as the signal change detection units are produced in positions shown by the double lines in the FIG. 12A so as to surround surrounded areas A, B and C shown by the chain lines in FIG. 12A. That is, coils A2, B2 and C2 are produced on the front-side supporting substrate 4a to be mounted on the front surface of the circuit board 1, while coils A1 and B1 are produced on the back-side supporting substrate 4b to be mounted on the back surface of the circuit board 1.

Incidentally, as for the surrounded area B, assume that the part 3 is mounted as a surface-mounted part on the front surface side of the circuit board 1, and only the coil B2 for observing the part 3 is produced on the front-side supporting substrate 4a from its front surface.

Here, description will be made on the operation in the case where the state of the circuit board 1 changes from a normal state to a failure state (1) or (2). Incidentally, assume that, of the wires connected to the connector 2 as shown in FIG. 12A, those in the solid lines pass on the front side of the circuit board 1 while those in the broken lines pass on the back side of the circuit board 1.

In the failure state (1) shown in FIG. 12B, of a wire group passing through the surrounded area A, one wire (wire A01) passing on the front side is disconnected. On the other hand, in the failure state (2) shown in FIG. 12B, of the same wire group, one wire (wire A02) passing on the back side is disconnected.

Figure 13A:
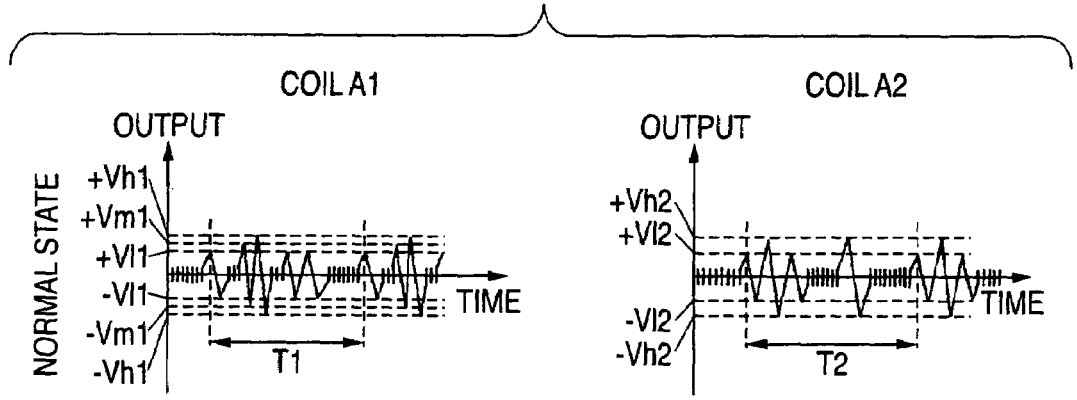
FIGS. 13A–13C are schematic diagrams showing output changes of coils in a normal state and respective failure states.
Figure 13B:
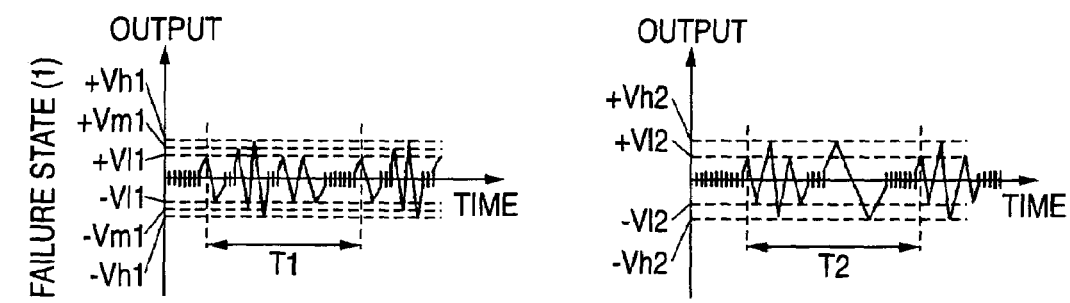
Figure 13C:
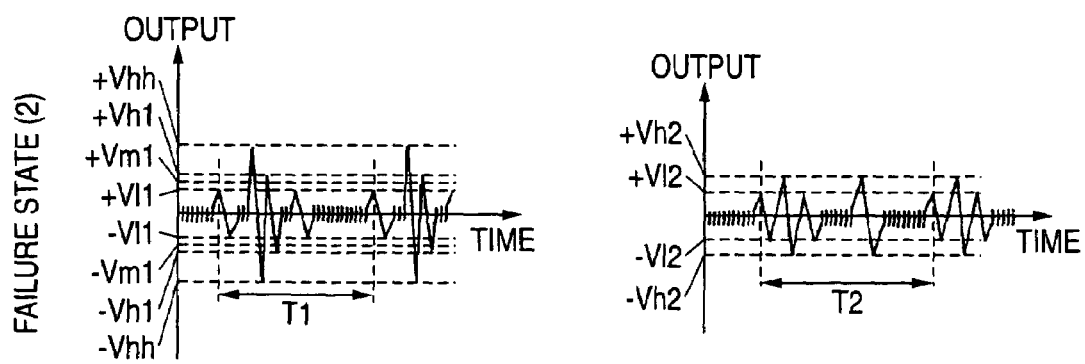

FIGS. 13A–13C are schematic diagrams showing output changes in the coils in the normal state and the respective failure states. FIG. 13A shows output signals, that is, induced electromotive forces of the coils A1 and A2 in the normal state shown in FIG. 12B. Likewise FIG. 13B shows output signals, that is, induced electromotive forces of the coils A1 and A2 in the failure state (1) shown in FIG. 12B. Likewise FIG. 13C shows output signals, that is, induced electromotive forces of the coils A1 and A2 in the failure state (2) shown in FIG. 12B.

First, in the normal state, the output waveform of the coil A1 is observed to have three kinds of peaks ±V11, ±Vm1 and ±Vh1 in a period T1 as illustrated. On the other hand, the output waveform of the coil A2 is observed to have two kinds of peaks ±V12 and ±Vh2 in a period T2 as illustrated.

In such a normal state, assume that there occurs a disconnection failure in the wire A01 on the front side of the circuit board in the surrounded area A. Then, the waveforms change into the failure state (1), so that there appears a change in the output waveform of the coil A2 on the front-side supporting substrate 4a disposed on the front side of the circuit board, as shown in FIG. 13B. That is, the time when there appears a fourth peak waveform having amplitude ±Vh2 and appearing after consecutive three peak waveforms is elongated.

On the other hand, no special change from the normal state is observed in the output waveform of the coil A1 on the back-side supporting substrate 4b disposed on the back side of the circuit board, as shown in FIGS. 13A and 13B.

Next, assume that there occurs a disconnection failure in the wire A02 on the back side of the circuit board in the surrounded area A. Then, the waveforms change into the failure state (2), so that there appears a change in the output waveform of the coil A1 on the back-side supporting substrate 4b disposed on the back side of the circuit board, as shown in FIG. 13C. That is, it is confirmed that, of the five peak waveforms appearing in one period, the amplitude of the second peak increases from ±Vm1 to ±Vhh while the fifth peak waveform having the amplitude ±V11 and observed in the normal state disappears.

On the other hand, no special change from the normal state is observed in the output waveform of the coil A2 on the front-side supporting substrate 4a disposed on the front side of the circuit board, as shown in FIGS. 13A and 13C.

As described above, for one surrounded area, signals sensed by the coils disposed on the front side and the back side of the circuit board 1 respectively are processed in a signal processing flow, so that the state where a signal to be inputted/outputted normally is not inputted/outputted in the area is read from both the coils disposed on the front side and the back side. Thus, it is possible to judge whether the area and the circuit board 1 having the area are normal or not.

Incidentally, although the aforementioned example has been described on the case where all the amplitudes of the output waveforms obtained from the coils are symmetric between the plus side and the minus side, the amplitudes can be asymmetric in some circuit configuration in the surrounded area. The circuit board inspection device according to the invention can be applied also to such a case. In addition, a part of the aforementioned method in which the coils are applied from both the front side and the back side onto one surrounded area depends on the intensity of a signal to be sensed or the circuit configuration in the surrounded area. In some case, the object can be attained only by disposing a coil on one of the front side and the back side.

In addition, the circuit using a sensed signal to compare its waveform with a normal waveform and judge a failure state may be included in the supporting substrate 4, 4a, 4b. Alternatively, the circuit may be provided outside the supporting substrate 4, 4a, 4b.

As described above, according to the invention, a failure of a circuit board can be identified with a simple configuration and at a low cost. In addition, according to the invention, the signal change detection units can be provided on the supporting substrate correspondingly to the positions of parts or wires mounted on an existing circuit board. Thus, the configuration corresponding to the parts layout of the circuit board can be achieved easily so that inspection on desired parts and the like can be performed properly.

Third Embodiment

Figure 14:
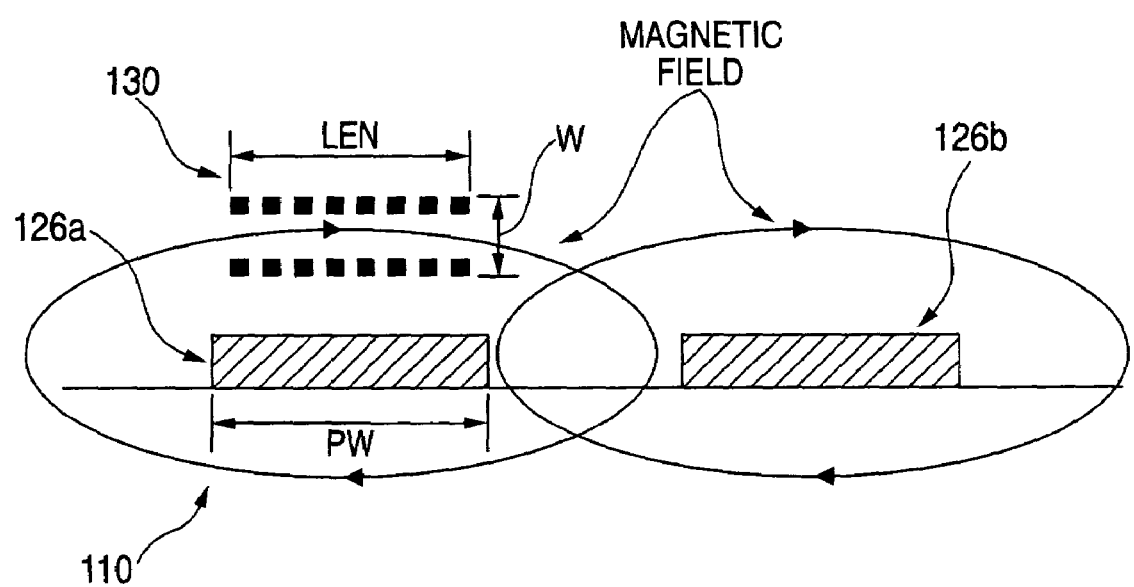
FIG. 14 is a diagram for explaining a basic configuration and operation of a spiral coil according to a third embodiment of the invention.

FIG. 14 is a diagram for explaining the fundamental configuration and operation for implementing the invention. Wiring patterns 126 are formed on the surface of a circuit board (printed board) 110 mounted with not-shown circuit members including passive parts such as resistive elements, inductive elements and capacitive elements, or active parts such as transistors and ICs (Integrated Circuits). In the example shown in FIG. 1, two wiring patterns 126a and 126b are disposed adjacently at a predetermined distance.

The wiring patterns 126a and 126b are chiefly microstrip lines, generating magnetic fields from currents flowing through their wires as shown in FIG. 14. A spiral coil (inductor shaped like a spiral coil) 130 whose magnetic path length LEN is substantially equal to the width PW of the wiring pattern is disposed above one wiring pattern 126a so as to be close to the wiring pattern 126a in a non-contact manner and so as to be perpendicular to the direction of a current flowing through the wiring pattern 126a, as shown in FIG. 14.

In such a manner, only a weak magnetic field generated by the other wiring pattern 126b adjacent to the wiring pattern 126a to be inspected is allowed to pass through the spiral coil 130 with a coil diameter W because the magnetic field generated by the wiring pattern 126b is distant from the spiral coil 130. Accordingly, only the magnetic field generated from the current flowing through the wiring pattern 126a to be inspected is allowed to pass through the spiral coil 130 efficiently. Then, only a change of a current flowing through the wiring pattern 126a to be inspected can be monitored by the induced electromotive force of the spiral coil 130.

For example, when f designates the magnetic flux generated from the current flowing through the wiring pattern 126 and passing through the spiral coil 130, an induced electromotive voltage V induced between the opposite ends of the spiral coil 130 is obtained in Expression (1).

$$V = d\Phi/dt \tag{1}$$

Incidentally, as long as the induced electromotive force generated in the spiral coil 130 as the magnetic field sensing portion can be read, the invention is not limited to the case where the induced electromotive voltage generated between the open ends of the spiral coil 130 is read, but may be also applicable to the case where the current flowing through the spiral coil 130 is read.

To reduce the influence of the adjacent wiring, it is preferable that the magnetic field from the wiring pattern 126b adjacent to the wiring pattern 126a to be inspected is prevented to the utmost from passing through the spiral coil 130. To this end, it is preferable that the magnetic path length of the spiral coil 130 is substantially equal to or smaller than the width of a predetermined wiring pattern corresponding to the portion to be failure-diagnosed in the circuit board.

In addition, in order to perform accurate inspection, it is desired that the physical position relation between the wiring pattern 126a to be inspected and the spiral coil 130 is fixed. To dispose the spiral coil 130 fixedly to a predetermined wiring pattern corresponding to the portion to be failure-diagnosed, it is preferable that the spiral coil 130 is formed out of a printed wiring pattern in an external layer (surface or back) or an internal layer in the circuit board.

Alternatively, a coil formed out of a winding wire in advance may be fixed substantially in close contact with a wiring pattern to be diagnosed but in an electrical non-contact manner by means of a retention member such as a taping member. In this case, for example, after a coil is formed to have a magnetic path whose open portion section is substantially circular or elliptic, the coil is compressed to be flat, and then disposed fixedly in a position corresponding to the portion to be diagnosed, so that the wiring pattern corresponding to the portion to be diagnosed and the flat surface of the coil are opposed to each other. In such a manner, the stability of the disposition is improved.

Figures 15A, 15B:
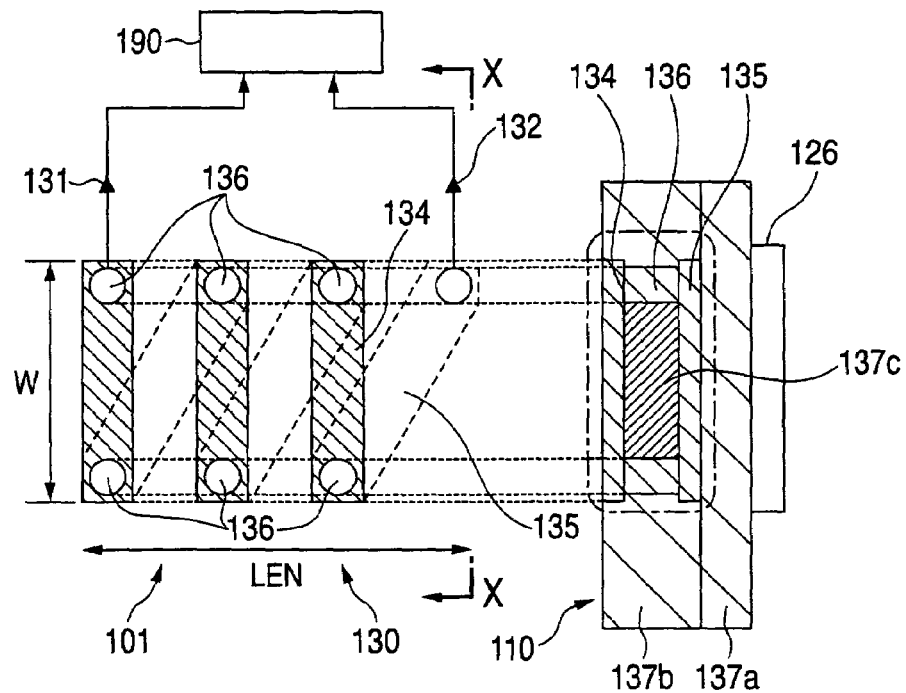
FIGS. 15A to 15D are diagrams showing an example of a failure diagnosis system using the mechanism shown in FIG. 14.
Figure 15C:
Figure 15D:
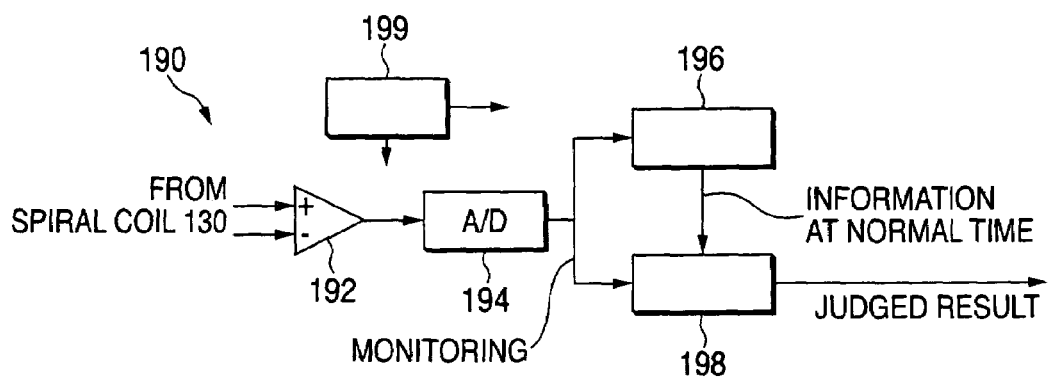

FIGS. 15A to 15D are diagrams showing an example of a failure diagnosis system 101 using the mechanism shown in FIG. 14. FIG. 15A is a schematic diagram showing the failure diagnosis system, together with a perspective plan view of a spiral coil 130 as a first example. FIG. 15B is a perspective sectional view of the spiral coil 130, taken along line X—X (in through hole portion) in FIG. 15A. FIG. 15C is a circuit symbol diagram of the spiral coil 130. FIG. 15D is a block diagram showing a detailed example of a failure diagnosis portion 190 constituting the failure diagnosis system 101. A first terminal 131 and a second terminal 132 shown by the circuit symbols in FIG. 15C correspond to the first terminal 131 and the second terminal 132 in the perspective plan view of FIG. 15A respectively.

The failure diagnosis system 101 has the spiral coil 130 disposed correspondingly to the wiring pattern 126 to be inspected, and the failure diagnosis portion 190 for diagnosing the existence of a failure of a signal in the wiring pattern 126 on the basis of the induced electromotive force detected by the spiral coil 130.

As shown in FIG. 15B, the circuit board 110 has a laminate of two insulators 137, while the wiring pattern 126 is formed by printing on the surface of one insulator 137a (right in FIG. 15B). The spiral coil 130 in the first example is formed out of printed wiring patterns formed on both sides of the other insulator 137b (left in FIG. 15B) opposed to the wiring pattern 126 with interposition of the insulator 137a. That is, the spiral coil 130 in the first example is formed on the same board as the circuit board (printed wiring board) 110 constituting a circuit.

Specifically, the spiral coil 130 in the first example has through holes (via holes) 136 and a plurality of conductors (a plurality of first conductors 134 and a plurality of second conductors 135) connected in predetermined order by use of the through holes 136 (to form a winding wire). The conductors are formed by partially cutting two conductor layers opposed to each other. An insulator 137c similar to the insulator 137b is disposed between opposed ones of the through holes 136.

As shown in FIG. 15A, the failure diagnosis portion 190 for detecting the existence of a failure in the circuit board 110 is connected to the first terminal 131 and the second terminal 132 which are the open ends of the spiral coil 130. When the power is supplied to the circuit board 110, the failure diagnosis portion 190 detects an induced electromotive force induced in the spiral coil 130 due to a magnetic field generated by the wiring pattern 126 in response to the operation of the circuit members of the circuit board 110. Then, the actual induced electromotive force is compared with a normal induced electromotive force (that is, an expected value) measured in advance, so that the existence of a failure in the circuit board 110 is diagnosed. Incidentally, the failure diagnosis portion 190 may be provided on the circuit board 110 so as to construct a diagnostic system in which the apparatus per se diagnoses its own board, for example, when the apparatus is started up.

As shown in FIG. 15D, the failure diagnosis portion 190 includes a buffer 192, an A/D (Analog to Digital) conversion portion 194, a storage portion 196, a comparison/judgment portion 198 and a control portion 199. The buffer 192 is constituted by a differential amplifier for detecting the induced electromotive force induced in the spiral coil 130 and amplifying the detected induced electromotive force to a predetermined level. The A/D conversion portion 194 converts the analog voltage supplied from the buffer 192, into digital data. The storage portion 196 is a semiconductor memory or the like for storing the induced electromotive force (expected value) induced in the spiral coil 130 at a normal time. The comparison/judgment portion 198 compares the actual induced electromotive force with the expected value stored in the storage portion 196, so as to judge the existence of a failure. The control portion 199 controls the failure diagnosis system 101 as a whole.

The induced electromotive force induced in the spiral coil 130 is amplified to a predetermined level by the buffer 192, and then converted into digital data by the A/D conversion portion 194. For example, the control portion 199 imports an induced electromotive force signal of the spiral coil 130 at a normal operation time, and stores the induced electromotive force signal into the storage portion 196. Incidentally, feature extraction may be performed to obtain an expected value based on an induced electromotive force signal obtained by measurement carried out once or based on average data detected a plurality of times.

Next, the comparison/judgment portion 198 operates the circuit actually. While importing the induced electromotive force signal of the spiral coil 130 at all times, the comparison/judgment portion 198 always compares the waveform of the induced electromotive force signal imported at all times with the normal waveform of the induced electromotive force signal stored in the storage portion 196 in accordance with an instruction of the control portion 199. When there appears a difference between the waveforms, the comparison/judgment portion 198 concludes that there occurs a failure in wiring of the circuit board or a part mounted on the circuit board. Then, when a failure is detected, an alarm is given by a not-shown alarm portion or a notification of the failure contents is issued. The alarm portion may be provided inside the apparatus having the failure diagnosis portion 190. Alternatively, when the failure diagnosis portion 190 is at a place far from the apparatus to be diagnosed, the failure diagnosis portion 190 may be installed in the site for central control of the conditions of the apparatus via a phone line or the Internet. In this case, the failure diagnosis portion 190 gives an alarm from the site.

Incidentally, for example, a feature quantity extraction portion for analyzing the feature of the read waveform may be provided to analyze the changed state of the waveform at a failure time in detail. Thus, the failure contents can be identified in more detail. Alternatively, beyond simple comparison between the waveforms, for example, a frequency analyzing portion may be provided to apply Fourier transform (not shown) to the read waveform to thereby confirm a frequency value where a peak appears. Thus, it is analyzed whether there occurs an abnormality in the circuit board 110 or not.

In the configuration as shown in FIGS. 2A–2D, the spiral coil 130 is formed out of printed wiring patterns. Accordingly, the physical position relation between the spiral coil 130 functioning as the magnetic field sensing portion and the wiring pattern 126 as the portion to be diagnosed on the circuit board 110 can be fixed without using any special retention member. Consequently, the state of the induced electromotive force at the time of acquiring an expected value (normal time) or during failure diagnosis can be stabilized surely. That is, the induced electromotive force as an index to judge the failure diagnosis can be acquired accurately so that the diagnosis performance is also improved.

In addition, the spiral coil 130 is disposed fixedly due to the printed wiring patterns. Therefore, it is not necessary to provide any mechanical means for observing the location to be diagnosed with a probe brought close thereto, or bringing a probe close to the portion to be diagnosed. When the circuit board is made up, the spiral coil 130 for sensing a magnetic field may be patterned integrally with the circuit board correspondingly to the wiring pattern which is the portion to be diagnosed (if there are a plurality of portions to be diagnosed, such spiral coils 130 are patterned correspondingly to the wiring patterns respectively). Thus, there is little additional cost for the board, but the spiral coil 130 can be realized at a low cost.

In such a manner, even in the case where the circuit operation is monitored over a plurality of desired ranges, it is possible to provide a failure diagnosis system in which the magnetic field sensing portion can be incorporated at a low cost and without adding any complicated failure diagnosis circuit to the electronic circuit of the system, and which can monitor the circuit operation with high accuracy.

Figure 16A:
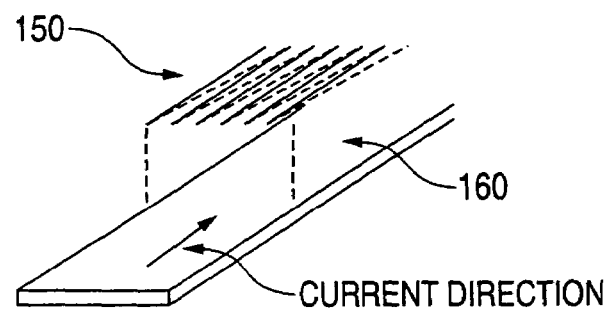
FIGS. 16A to 16C are diagrams showing a second example of the spiral coil formed on the same board as a circuit board.
Figure 16B:
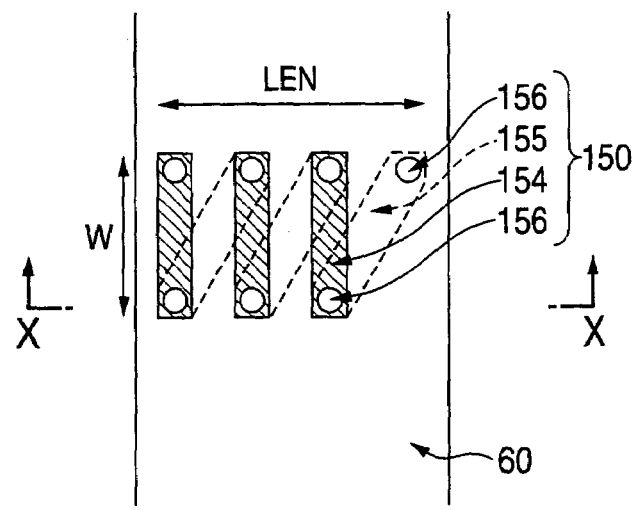
Figure 16C:
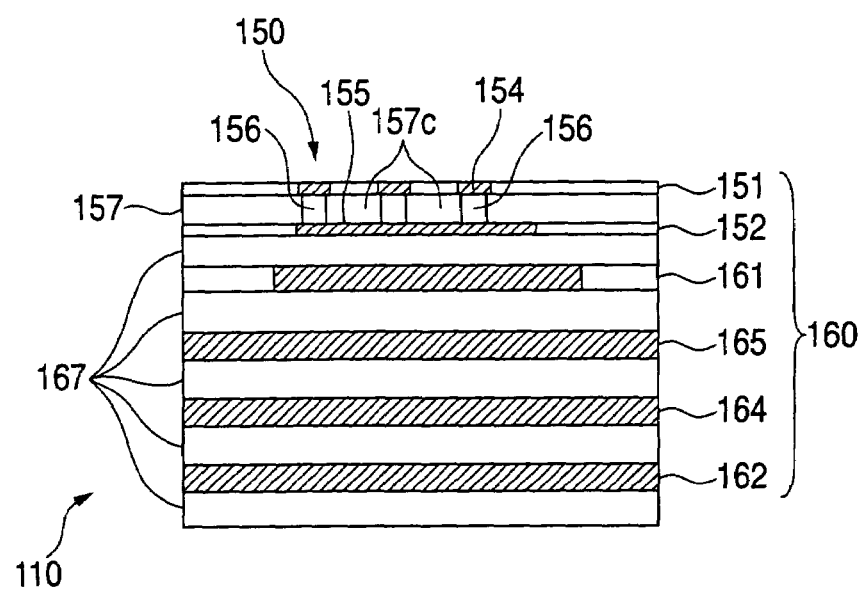

FIGS. 16A to 16C are diagrams showing a second example in which a spiral coil is arranged on the same board as the circuit board 110 constituting a circuit. FIG. 16A is a diagram showing the spatial arrangement relation between a spiral coil 150 in the second example and a wiring pattern 160. FIG. 16B is a perspective plan view of the spiral coil 150 and the wiring pattern 160. FIG. 16C is a perspective sectional view of the spiral coil 150, taken along line X—X (in through hole portion) in FIG. 16B.

As shown in FIG. 16C, the circuit board 110 is formed as a circuit board in which a first wiring layer 161, a ground layer 165, a power supply layer 164 and a second wiring layer 162 for forming the wiring pattern 160 are laminated with interposition of insulating layers 167 in that order. Then, on the opposite side (upper side in FIG. 16C) of the first wiring layer 161, the spiral coil 150 in the second example is further laminated and patterned with interposition of the insulating layer 167 by a printed wiring pattern.

That is, the spiral coil 150 in the second example is also formed on the same board as the circuit board 110 constituting a circuit. Specifically, in the spiral coil 150 in the second example, two coil layers (conductor layers) 151 and 152 and insulating layers 157 are added onto the layer forming the wiring pattern 160. A plurality of first conductors 154 are formed by patterning in the first coil layer 151, and a plurality of second conductors 155 are formed by patterning in the second coil layer 152.

The first conductors 154 and the second conductors 155 are connected in predetermined order by use of the through holes 156 (so as to form a winding wire). Thus, the spiral coil 150 in the second example is formed. Insulators 157c each similar to the insulating base material forming the outside insulating layer 157 are disposed between the through holes 156 in the insulating layer 157, so as to form a part of the insulating layer 157.

The spiral coil 150 is disposed on the wiring pattern 160 (particularly a wire formed out of the first conductor 154 and opposed to the spiral coil 150) where the circuit operation should be monitored. In that event, as shown in FIG. 16A, on the assumption that W designates the diameter of the coil and LEN designates the magnetic path length of the coil, the magnetic path length LEN is made substantially equal to or smaller than the wire width PW. Thus, the influence of magnetic flux due to an adjacent wire can be minimized, and the magnetic flux due to the wire to be diagnosed can be detected efficiently.

The distance between the first coil layer 151 and the second coil layer 152 depends on the thickness of the insulating layer 157. Thus, the distance is apt to be limited by the specifications of the board to be used (there is no degree of freedom in design) On the other hand, the coil diameter W can be adjusted by the pattern lengths of the first conductors 154 and the second conductors 155 (substantially equal to the distance between the through holes 56 on the opposite ends). When the coil diameter W is increased, the magnetic flux passing through the spiral coil 150 increases. Accordingly, if the pattern lengths of the first conductors 154 and the second conductors 155 are adjusted when the pattern is designed, the coil diameter W can be adjusted in accordance with the magnitude of the induced electromotive force.

Figure 17A:
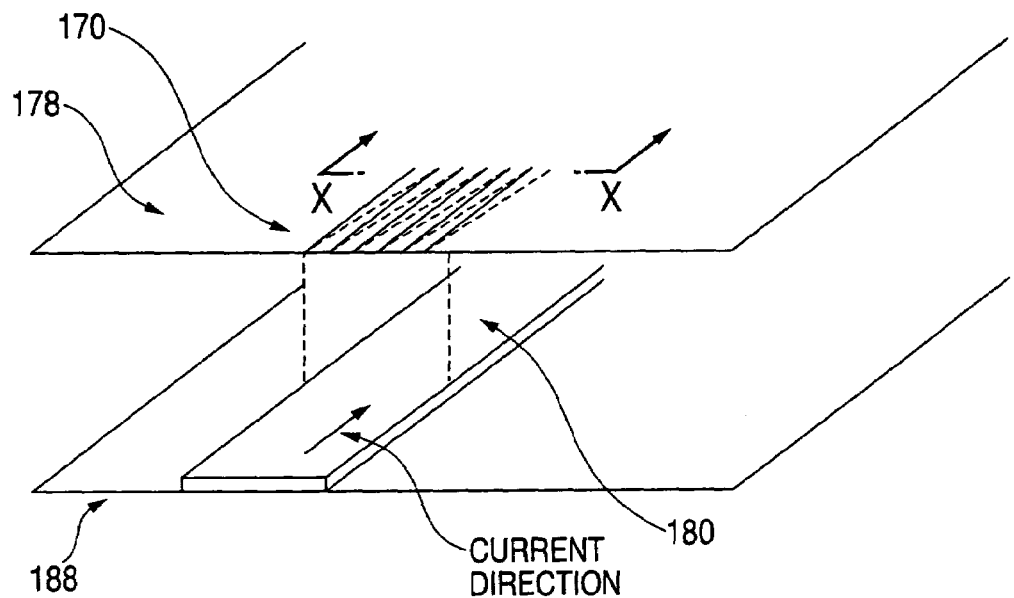
FIGS. 17A and 17B are diagrams showing a third example of the spiral coil.
Figure 17B:
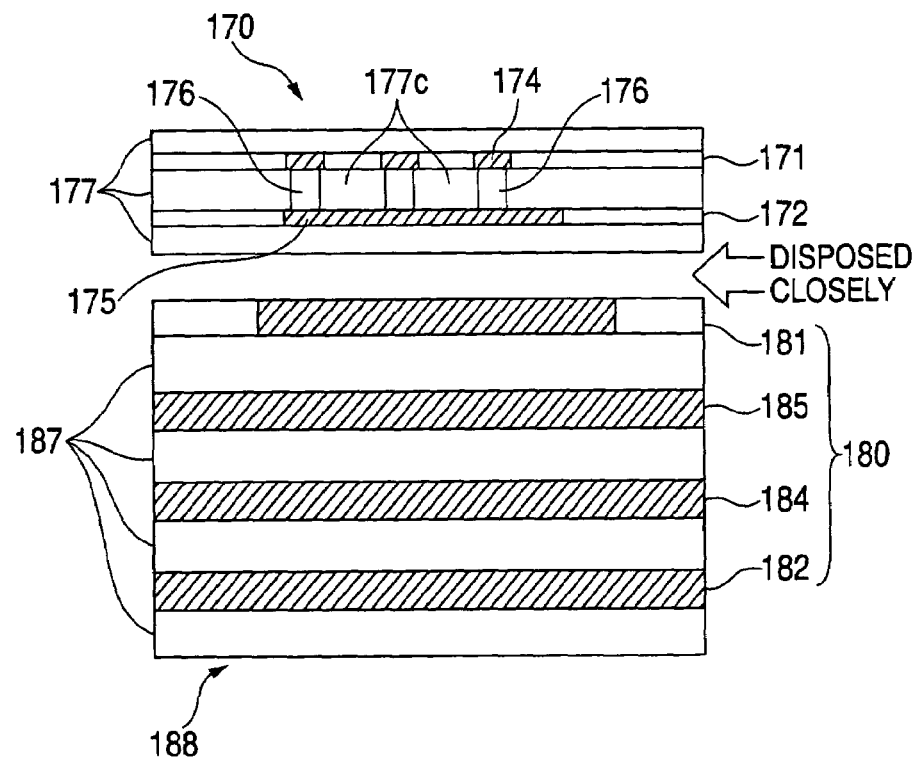

FIGS. 17A and 17B are diagrams showing a third example of a spiral coil. FIG. 17A is a diagram showing the spatial arrangement relation between a spiral coil 170 in the third example and a wiring pattern 160. FIG. 17B is a perspective sectional view of the spiral coil 170, taken along line X—X (in through hole portion) in FIG. 17A.

The spiral coil 170 in the third example is formed on a board different from a printed wiring board 188 constituting a circuit, for example, on an FPC (Flexible Printed Circuit) board 178 in the same manner as in the first example. The FPC board 178 on which the spiral coil 170 is formed is disposed close to the printed wiring board 188.

Specifically, in the spiral coil 170 in the third example, two coil layers (conductor layers) 171 and 172 and insulating layers 177 are provided. A plurality of first conductors 174 are formed by patterning in the first coil layer 171, and a plurality of second conductors 175 are formed by patterning in the second coil layer 172. Then, the first conductors 174 and the second conductors 175 are connected in predetermined order by use of through holes 176 (so as to form a winding wire). In this way, the spiral coil 170 in the third example is formed.

Insulators 177c each similar to the insulating base material forming the outside insulating layer 177 are disposed between the through holes 716 in the insulating layer 177, so as to form a part of the insulating layer 177. The insulating layers 177 are also formed on the surfaces of the two coil layers 171 and 172. As the base material forming the insulating layers 177, a flexible plastic material (e.g. polyimide) is used.

The printed wiring board 188 forming the circuit is formed as a circuit board in which a first wiring layer 181, a ground layer 185, a power supply layer 184 and a second wiring layer 182 for forming a wiring pattern 180 are laminated with interposition of insulating layers 187 in that order in the same manner as the portion of the wiring pattern 160 in the circuit board 110 shown in the second example.

The spiral coil 170 on the FPC board 178 is also arranged so that the spiral coil 170 is disposed correspondingly to the wiring pattern 180 (particularly a wire in the first wiring layer 181) where the circuit operation should be monitored. The spiral coil 170 is aligned with the wiring pattern 180 and disposed close thereto.

Figure 18:
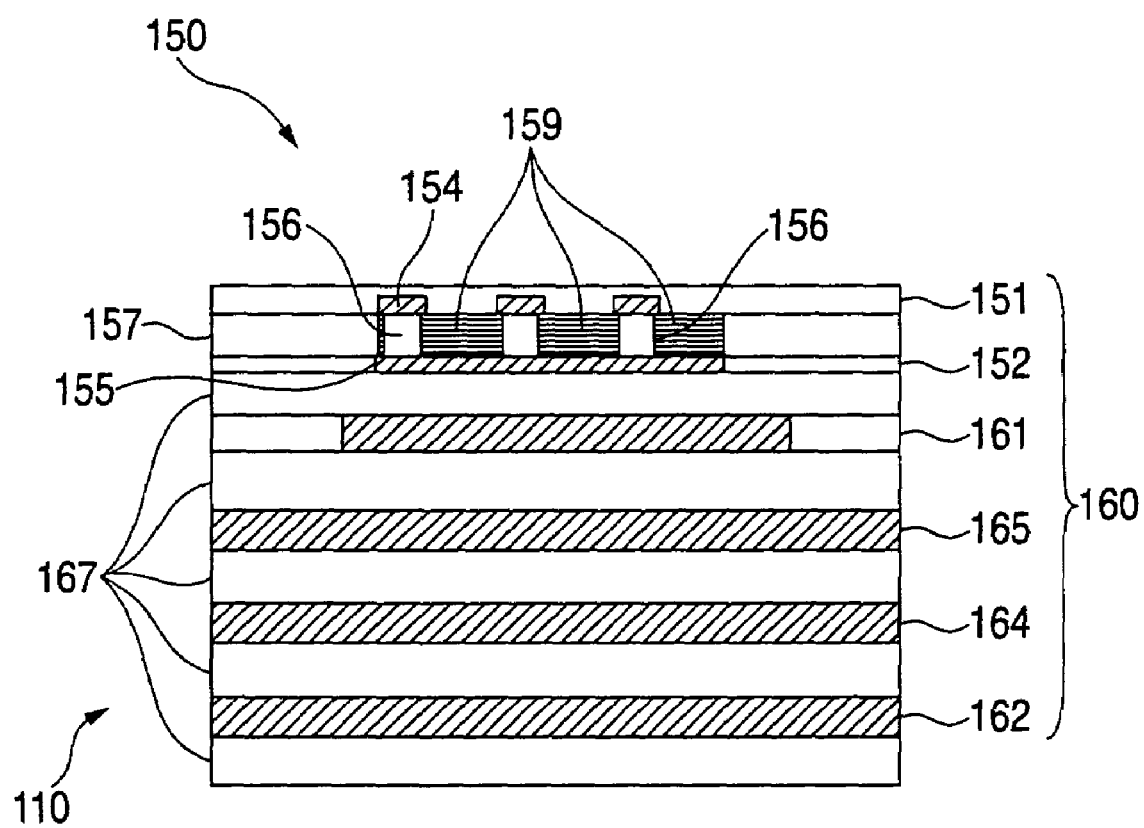
FIG. 18 is a diagram showing a fourth example of the spiral coil.

FIG. 18 is a diagram showing a fourth example of a spiral coil, and illustrating a perspective sectional view of the spiral coil portion. A spiral coil 150 in this fourth example is a modification of the spiral coil 150 in the second example. The spiral coil 150 in the fourth example has a structure in which parts of the insulating layer 157 disposed between the two opposed coil layers (conductor layers) 151 and 152 forming the spiral coil 150, specifically the insulators 157c disposed among the through holes 156 or the outside of the through holes 156 in the insulating layer 157 are replaced by an insulating magnetic substance layer 159. That is, the spiral coil 150 has a structure in which an insulating magnetic substance is displaced stratiformly as parts between the two opposed conductor layers (coil layers 151 and 152) used for forming the spiral coil 150.

As the technique for disposing the insulating magnetic substance stratiformly between the two conductor layers, for example, the technique disclosed in JP-A-11-40915 is preferably used. For example, an insulating magnetic substance may be used as the magnetic material forming the insulating magnetic substance layer 159. For example, a mixture of Ni—Zn-based ferrite impalpable powder, Mn—Zn-based ferrite impalpable powder, Sendust impalpable powder or Li-based ferrite impalpable powder and an insulating solvent may be used as the insulating magnetic substance. The insulating solvent may include an epoxy-based insulating solvent.

Incidentally, metal foil subjected to insulating coating on its both sides may be used as the insulating magnetic substance disposed between the two coil layers 151 and 152. The metal foil subjected to insulating coating on its both sides may include an amorphous magnetic foil multilayer band.

Further, not the portions of the insulators 157c disposed among the through holes 156 in the insulating layer 157 but the whole of the insulating layer 157 may be replaced by an insulating magnetic substance layer 159. That is, the spiral coil 150 may have a structure in which an insulating magnetic substance is disposed into stratiformly all over the area between the two opposed conductor layers (coil layers 151 and 152) used for forming the spiral coil 150.

When an insulating magnetic substance is disposed over the partial or whole area between the two opposed conductor layers (coil layers 151 and 152) used for forming the spiral coil 150 in such a manner, the inductance of the spiral coil 150 can be increased so that the sensitivity of the spiral coil 150 can be improved. Thus, it is possible to construct a higher-accuracy failure diagnosis system.

Incidentally, the mechanism in which an insulating magnetic substance layer is disposed as in the fourth example can be applied not only to the spiral coil 150 according to the second example but also other ones in the same manner. For example, an insulating magnetic substance may be disposed partially between the two conductor layers forming the spiral coil 130 in the first example (that is, over the insulators 137c disposed among the through holes 136) or all over the area between the two conductor layers. Likewise, an insulating magnetic substance may be disposed partially between the two coil layers 171 and 172 forming the spiral coil 170 in the third example (that is, over the insulators 177c disposed among the through holes 176) or all over the area between the two coil layers 171 and 172.

Fourth Embodiment

Figure 19A:
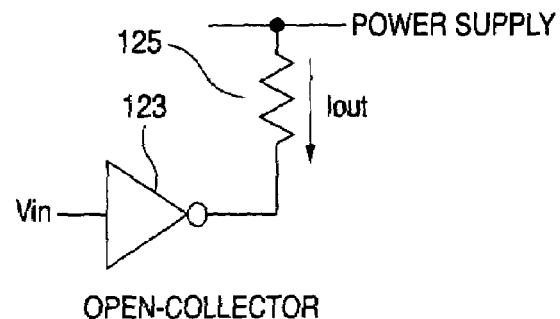
FIGS. 19A to 19C are diagrams for explaining an fourth embodiment in which the failure diagnosis system is applied to a circuit and a printed wiring board.
Figure 19B:
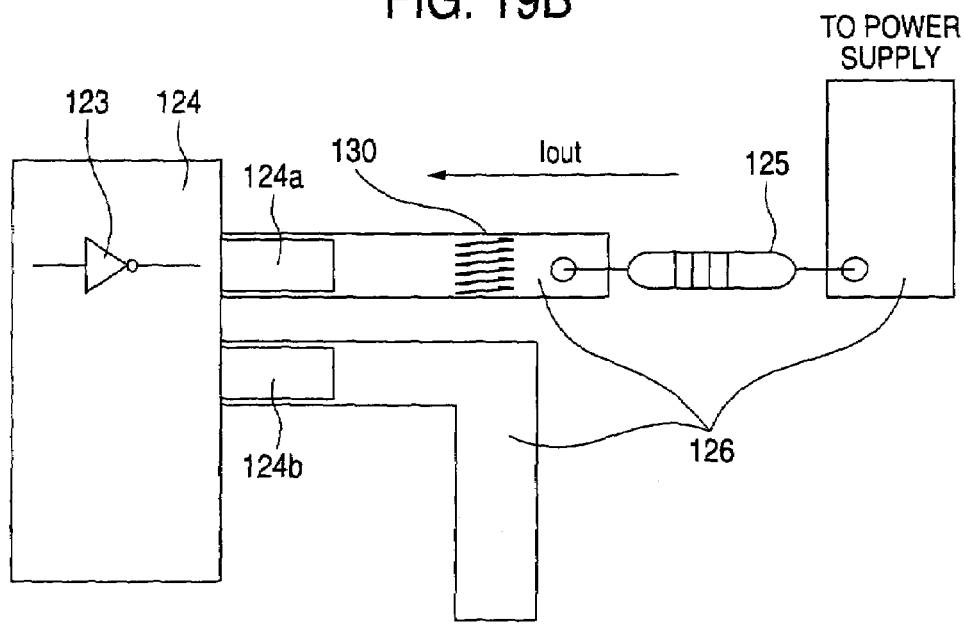
Figure 19C:
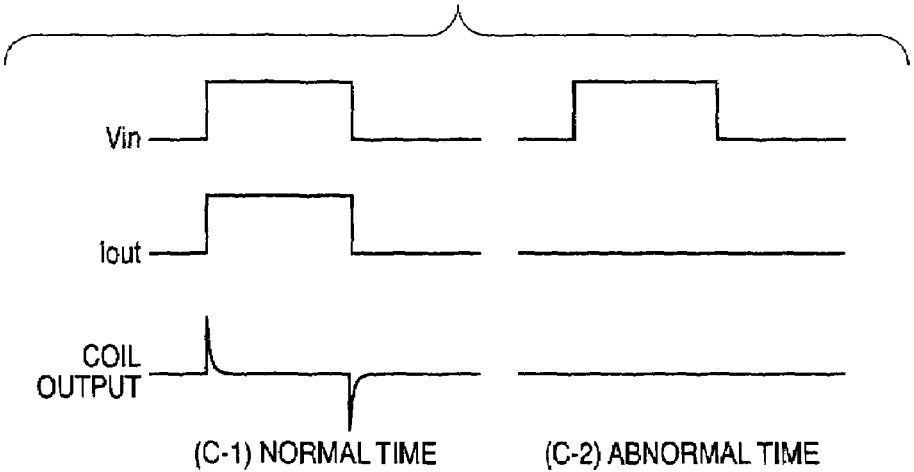

FIGS. 19A to 19C are diagrams for explaining an embodiment in which the failure diagnosis system 101 is applied to a circuit and a printed wiring board. FIG. 19A shows an open-collector type inverter circuit for receiving a digital signal Vin and allowing a current Iout to flow into a resistive element 125 as a load resistor. FIG. 19B is a diagram showing an example in which a spiral coil is disposed on a printed wiring board having an inverter circuit disposed therein. FIG. 19C is a diagram showing an example of a signal waveform when the inverter circuit is operated.

As shown in FIG. 19A, the open-collector type inverter circuit is constituted by an open-collector inverter element 123 and the resistive element 125 connected as a pull-up resistor to the output of the open-collector inverter element 123. In the example shown in FIG. 19B, one terminal of the resistive element 125 is connected through a wiring pattern 126 to a terminal 124a of an inverter IC 124 having a plurality of inverter elements 123 formed therein. The other terminal of the resistive element 125 is connected to a not-shown power supply through another wiring pattern 126.

Then, the spiral coil 130 according to the first example, which is aimed for detection at the wiring pattern 126 connected to the terminal 124a, is disposed on the wiring pattern 126. The both ends of the spiral coil 130 are connected to a not-shown failure diagnosis portion 190 (see FIG. 15D). The spiral coil 130 is not limited to one according to the first example but may be one according to any one of the second to fourth examples.

When the input voltage Vin supplied to the inverter element 123 is in low level, the output of the open-collector type inverter element 123 is brought into a high impedance state. Thus, the output of the inverter element 123 pulled up by the resistive element 125 comes into high level. Then, when the input voltage Vin of the inverter element 123 changes from low level to high level, the output of the open-collector type inverter element 123 changes to low level. Thus, the current Iout flows into the resistive element 125.

A variation of the current in the resistive element 125 is outputted as the induced electromotive force of the spiral coil 130. Thus, when the circuit is normal, a differential waveform as shown in the diagram (C-1) of FIG. 19C is supplied to the spiral coil 130. On the other hand, for example, when the inverter element 123 is normal but the resistive element 125 gets out of order to be thereby opened (as an example of the failure time), the current will not be allowed to flow into the resistive element 125 even if the input voltage Vin of the inverter element 123 changes from low level to high level, as shown in the diagram (C-2) of FIG. 19C. Thus, no induced electromotive force is supplied to the spiral coil 130.

Thus, the not-shown failure diagnosis portion 190 always performing processing of comparison of the actual waveform with the normal waveform can conclude that there appears a difference in waveform. That is, the failure diagnosis portion 190 can detect that a failure occurs in the circuit (the resistive element 125 in this embodiment). In addition, it is observed from the waveform at the time of failure as shown in the diagram (C-2) of FIG. 19C that no current Iout flows into the resistive element 125. Thus, the failure diagnosis portion 190 can specify the failure as open failure of the resistive element 125 when the inverter element 123 is normal.

Fifth Embodiment

Figure 20:
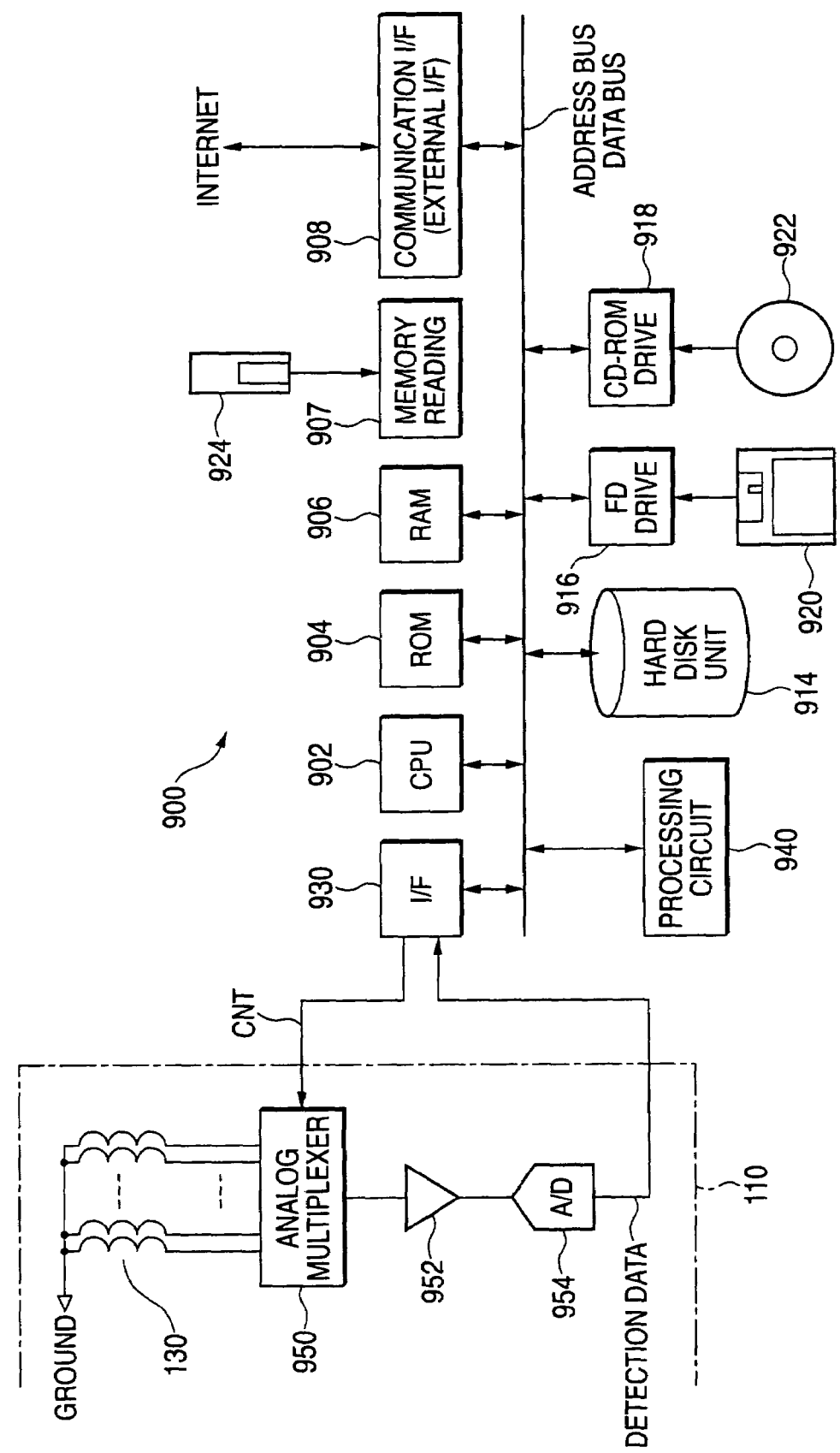
FIG. 20 is a diagram showing an example of a hardware configuration where the failure diagnosis system is constructed by use of an electronic computer.

FIG. 20 is a diagram showing an example of the hardware configuration when a failure diagnosis system is constructed by software by use of a CPU and a memory, that is, when a failure diagnosis system is constructed by use of an electronic computer such as a personal computer.

A computer system 900 constituting the failure diagnosis portion 190 has a CPU 902, a ROM (Read Only Memory) 904, a RAM 906 and a communication I/F (Interface) 908. The RAM 906 includes an area for storing picked-up image data.

In addition, the computer system 900 may have a recording/reading unit for recording/reading data into/from a storage medium, such as a memory reading portion 907, a hard disk unit 914, a flexible disk (FD) drive 916, or a CD-ROM (Compact Disk ROM) drive 918. The data is exchanged among the respective pieces of the hardware through a data bus.

For example, the hard disk unit 914, the FD drive 916 or the CD-ROM drive 918 serves to register program data for engaging the CPU 902 in software processing. In addition, the hard disk unit 914 includes an area for storing data to be processed.

The communication I/F 908 interfaces with a communication network such as the Internet for transmission/reception of communication data. In addition, the computer system 900 has an I/F portion 930 functioning as an interface with the circuit board 110.

Incidentally, all the processing of each function part (particularly the comparison/judgment portion 198) of the failure diagnosis portion 190 shown in the embodiment does not have to be performed by software. Those function parts may be partially implemented by hardware as a processing circuit 940.

In the circuit board 110, an analog multiplexer 950, a buffer circuit 952 and an A/D conversion portion 954 are disposed as circuit members constituting parts of the failure diagnosis portion 190. For example, the analog multiplexer 950 is provided correspondingly to a plurality of wiring patterns 126 as portions to be inspected. Spiral coils 130 according to the first example are disposed for the individual wiring patterns 126 to be inspected on the circuit board 110. The spiral coils 130 are not limited to ones according to the first example, but may be ones according to any one of the second to fourth examples.

One terminal of each spiral coil 130 is connected to the ground in common, while the other terminal of the spiral coil 130 is connected to a corresponding input terminal of the analog multiplexer 950. The selection operation of the analog multiplexer 950 is controlled by a control signal CNT from the I/F portion 930 of the computer system 900.

An output signal of the analog multiplexer 950 is converted into digital data by the A/D conversion portion 954 via the buffer circuit 952. The digital detection data outputted from the A/D conversion portion 954 is supplied to the I/F portion 930 of the computer system 900 via a not-shown output buffer.

The computer system 900 configured thus has a basic configuration and operation similar to those of the failure diagnosis portion 190 shown in the above embodiment. In addition, the program for making the computer execute the aforementioned processing is distributed through a recording medium such as a CD-ROM 922. The program may be stored not in the CD-ROM 922 but an FD 920. Alternatively, an MO drive may be provided for storing the program into an MO, or the program may be stored in other recording media including a nonvolatile semiconductor memory card 924 such as a flash memory.

Further, to acquire or update the program, the program may be downloaded from another server or the like via a communication network such as the Internet. Incidentally, not only the FD 920, the CD-ROM 922 and the like but also optical recording media such as DVD, magnetic recording media such as MD, magneto-optical recording media such as PD, tape media, magnetic recording media, semiconductor memories such as IC cards or miniature cards may be used as the recording media.

Parts or all of processing/functions in the failure diagnosis portion 190 described in the above embodiment can be stored in the FD 920, the CD-ROM 922 or the like by way of example of recording media. That is, software to be installed in the RAM 906 or the like includes function portions such as the comparison/judgment portion 98, the feature quantity extraction portion or the frequency analysis portion in the same manner as the failure diagnosis portion 90 described in the embodiment. The software may be stored in a portable recording medium such as a CD-ROM or an FD, or distributed via a network, in the form of application software for monitoring a failure.

When the failure diagnosis portion 190 is constituted by a computer, the CD-ROM drive 918 reads data or a program from the CD-ROM 922, and delivers the data or program to the CPU 902. Then, the software is installed from the CD-ROM 922 to the hard disk unit 914. The hard disk unit 914 stores the data or program read by the FD drive 916 or the CD-ROM drive 918, or data created by the program executed by the CPU 902. In addition, the hard disk unit 914 reads the stored data or program and delivers it to the CPU 902.

The software stored in the hard disk unit 914 is read into the RAM 906, and then executed by the CPU 902. For example, the CPU 902 executes the aforementioned processing on the basis of the programs stored in the ROM 904 and the RAM 906 as examples of recording media. For example, first, upon normal operation, induced electromotive force signals of the spiral coils 130 are imported while being changed over by the analog multiplexer 950. The induced electromotive force signals are stored in a storage unit such as the hard disk unit 914. Next, upon actual operation of the circuit, signals of the spiral coils 130 are always imported. At the same time, each waveform always imported is compared with the normal waveform stored in the hard disk unit 914 or the like in accordance with an instruction of the CPU 902. When there appears a difference between the waveforms, it is concluded that a failure occurs, and an alarm is given or a notification of the failure contents is issued. In addition, the changed state of the waveform upon failure is analyzed in detail so that the failure contents are identified in detail.

Although the invention has been described in connection with the embodiments, the technical scope of the invention is not limited to the scope described in the embodiments. Various modifications or improvements can be applied to the embodiments without departing from the gist of the invention. Any mode subjected to such a modification or an improvement is also included in the technical scope of the invention.

In addition, the embodiments are not to limit the inventive configuration according to any one of the claims, and the combination of all the characteristics described in the embodiments is not always essential to the solving means according to the invention. The embodiments include various stages of the invention, and various modes of the invention can be extracted in accordance with desired combinations of a plurality of the disclosed requirements. If some effect can be obtained in spite of deletion of some requirements from the whole requirements shown in the embodiments, the configuration with those some requirements deleted can be extracted as the invention.

For example, although the spiral coil according to any one of the first to fourth examples shows a mode where the spiral coil is formed by patterning on a printed board correspondingly to a portion to be diagnosed, the spiral coil may be formed not by patterning but another manner. For example, as described in FIG. 14, a coil formed out of a winding wire in advance may be fixed in an electrical non-contact manner by use of a retention member such as a taping member.

Although a wiring pattern connected to a part to be diagnosed is described as the portion to be diagnosed in the embodiments by way of example, the portion to be failure-diagnosed is not limited to such a wiring pattern. For example, the portion to be failure-diagnosed may be a terminal of a target part or the part per se.

As described above, according to the invention, each spiral coil is disposed fixedly in a position where the spiral coil is opposed to an individual portion to be diagnosed, so that the physical position relation between the spiral coil functioning as a magnetic field sensing portion and the portion to be diagnosed can be fixed. As a result, the state of an induced electromotive force at the time of acquiring an expected value (normal time) or during failure diagnosis is stabilized surely. Thus, the induced electromotive force as an index to judge the failure diagnosis can be acquired accurately so that the diagnosis performance is improved.

In addition, the number of spiral coils installed can be set desirably in accordance with portions to be failure-diagnosed. For example, when the circuit operation is monitored over a plurality of desired ranges, it is easy to dispose spiral coils correspondingly to the plurality of portions respectively. As a result, since the circuit operation is monitored over a plurality of desired ranges, it is not necessary to incorporate a plurality of complicated exclusive probes in the system or to provide any means for moving the probes.

In such a manner, according to the invention, an easy structure suffices in which spiral coils are merely installed suitably in accordance with the degree of request to specify portions to be failure-diagnosed. In addition, as a result, it is possible to provide a user-friendly mechanism of failure diagnosis in view of the cost and the degree of freedom in setting portions to be failure-diagnosed.

What is claimed is:

1. A circuit board inspection device for inspecting operation of a circuit board having a predetermined part or wire formed therein, comprising:

a supporting substrate disposed substantially in parallel with a parts mounting surface of the circuit board, the supporting substrate being near the circuit board at least when in use; and a signal change detection unit disposed in a position of the supporting substrate directly opposite to the part or wire of the circuit board, with the supporting substrate being disposed substantially in parallel with the circuit board, wherein the supporting substrate is made of a thin substrate having flexibility.

2. The circuit board inspection device according to claim 1, wherein the signal change detection unit includes a coil for generating an induction voltage in accordance with a magnetic field generated from a current flowing through the part.

3. The circuit board inspection device according to claim 1, wherein the signal change detection unit includes an impedance component for generating electrical potential information in accordance with a change of a signal flowing through the wire.

4. The circuit board inspection device according to claim 1, wherein the supporting substrate has substantially the same dimensions as the circuit board.

5. The circuit board inspection device according to claim 1, wherein a hole for avoiding the supporting substrate to come into contact with the predetermined part of the circuit board is formed in a position of the supporting substrate corresponding to the part, with the supporting substrate being disposed substantially in parallel with the circuit board.

6. The circuit board inspection device according to claim 1, wherein the supporting substrate is provided to be assemblable into a box, and the supporting substrate assembled into a box is disposed substantially in parallel with the circuit board.

7. The circuit board inspection device according to claim 2, wherein the coil is wound around the supporting substrate correspondingly to an outer circumference of the circuit board.

8. The circuit board inspection device according to claim 2, wherein the coil is wound around the supporting substrate correspondingly to an outer circumference of the part.

9. The circuit board inspection device according to claim 2, wherein the coil is wound around the supporting substrate correspondingly to a position of a terminal of the part.

10. The circuit board inspection device according to claim 2, wherein the coil is wound around the supporting substrate correspondingly to a position of an input/output connector of the circuit board.

11. The circuit board inspection device according to claim 2, wherein there are a plurality of the circuit boards, and the coil is wound around the supporting substrate correspondingly to a position of a cable connecting the circuit boards.

12. The circuit board inspection device according to claim 2, wherein the coil is wound around the supporting substrate correspondingly to an outer circumference of a circuit board group in which a plurality of the circuit boards are connected.

13. The circuit board inspection device according to claim 3, wherein the impedance component is made of a capacitive component.

14. The circuit board inspection device according to claim 3, wherein the impedance component is made of an inductive component.

15. The circuit board inspection device according to claim 3, wherein the impedance component is made of a resistive component.

16. The circuit board inspection device according to claim 3, wherein the impedance component is disposed on the supporting substrate so as to substantially cross a direction of the wire of the circuit board at right angles.

17. The circuit board inspection device according to claim 1, wherein the signal change detection unit is disposed astride a plurality of layers of the support substrate.

18. The circuit board inspection device according to claim 2, wherein the coil is formed with an equal number of turns for each of a plurality of layers of the supporting substrate.

19. The circuit board inspection device according to claim 13, wherein the capacitive component is made of electrodes provided in two of a plurality of layers of the supporting substrate.

20. The circuit board inspection device according to claim 1, wherein a plurality of the signal change detection units are provided, and on-side terminals of the signal change detection units are connected in common.

21. The circuit board inspection device according to claim 20, wherein a common terminal in which the one-side terminals of the signal change detection units are connected in common is grounded outside the supporting substrate.

22. The circuit board inspection device according to claim 20, wherein the one-side terminals of the signal change detection units are connected in common in an end portion of the supporting substrate.

23. The circuit board inspection device according to claim 1, wherein a plurality of the signal change detection units are provided, and terminals of the signal change detection units are led into the supporting substrate closely to one another and substantially in parallel with one another.

24. The circuit board inspection device according to claim 1, wherein the supporting substrate comprises a front-side supporting substrate disposed on a front side of the circuit board, and a back-side supporting substrate disposed on a back side of the circuit board;
  the front-side supporting substrate is provided with the signal change detection unit in a position corresponding to a part or a wire mounted on the front side of the circuit board; and
  the back-side supporting substrate is provided with the signal change detection unit in a position corresponding to a part or a wire mounted on the back side of the circuit board.

25. The circuit board inspection device according to claim 1, wherein the supporting substrate comprises a front-side supporting substrate disposed on a front side of the circuit board, and a back-side supporting substrate disposed on a back side of the circuit board; and
  the signal change detection unit is formed astride both the front-side supporting substrate and the back-side supporting substrate.

26. The circuit board inspection device according to claim 1, wherein the supporting substrate comprises a front-side supporting substrate disposed on a front side of the circuit board, and a back-side supporting substrate disposed on a back side of the circuit board; and
  the front-side supporting substrate and the back-side supporting substrate are formed integrally.

27. The circuit board inspection device according to claim 25, wherein the signal detection unit is provided only one of the front-side supporting substrate and the back-side supporting substrate correspondingly to a side of the circuit board on which the part or wire to be inspected is disposed.

28. The circuit board inspection device according to claim 26, wherein the signal detection unit is provided only one of the front-side supporting substrate and the back-side supporting substrate correspondingly to a side of the circuit board on which the part or wire to be inspected is disposed.

29. The circuit board inspection device according to claim 1, further comprising:
  a signal check portion for comparing a signal detected by the signal change detection unit with a normal signal stored in advance; and
  a diagnosis portion for performing diagnosis as to whether the portion to be inspected operates normally or not, based on a comparison result of the signal check portion.

30. The circuit board inspection device according to claim 29, wherein the signal check portion and/or the diagnosis portion are provided on the supporting substrate.

31. The circuit board inspection device according to claim 29, wherein the signal check portion and the diagnosis portion are provided outside the supporting substrate.

* * * * *